(12) United States Patent
Mirtich et al.

(10) Patent No.: US 8,380,467 B1
(45) Date of Patent: Feb. 19, 2013

(54) REPRESENTING GEOMETRY OF A SYSTEM IN A MODELING ENVIRONMENT

(75) Inventors: Brian Mirtich, Phoenix, AZ (US); Jeff Wendlandt, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 279 days.

(21) Appl. No.: 12/837,638

(22) Filed: Jul. 16, 2010

(51) Int. Cl.
*G06F 17/50* (2006.01)
(52) U.S. Cl. .................. 703/2; 703/6; 703/22; 345/474; 600/407
(58) Field of Classification Search .................. 703/2, 6, 703/22; 345/474; 600/407
See application file for complete search history.

(56) References Cited

U.S. PATENT DOCUMENTS

| | | | |
|---|---|---|---|
| 6,714,201 B1 * | 3/2004 | Grinstein et al. | 345/474 |
| 7,373,284 B2 * | 5/2008 | Stabelfeldt et al. | 703/2 |
| 8,112,142 B2 * | 2/2012 | Alexander et al. | 600/407 |
| 2005/0256686 A1 * | 11/2005 | Stabelfeldt et al. | 703/6 |

OTHER PUBLICATIONS

Imagine S.A., "AMESim, Version 4.2," (2004).
Mitiguy, Paul and Woo, Michael, "Welcome to Working Model," retrieved online at http://www.workingmodel.com (2010).
The MathWorks, "SimPowerSystems 5, User's Guide," Matlab & Simulink, The MathWorks Inc. (1998-2009).
The MathWorks, "SimPowerSystems 5, Reference," Matlab & Simulink, The MathWorks Inc. (1998-2009).
The MathWorks, "SimPowerSystems Release Notes," The MathWorks, Inc. (2003-2009).
Dynasim AB, "Dymola, Dynamic Modeling Laboratory, User's Manual, Version 5.0," (2002).
The MathWorks, "SimMechanics 3, Getting Started Guide," The MathWorks, Inc. (2009).
The MathWorks, "SimMechanics 3, Reference," The MathWorks, Inc. (2009).
The MathWorks, "SimMechanics 3, User's Guide," The MathWorks, Inc. (2009).
The MathWorks, "SimMechanics Link 3, Reference," The MathWorks, Inc. (2009).
The MathWorks, "SimMechanics Link 3, User's Guide," The MathWorks, Inc. (2009).
Mitiguy, Paul and Michael Woo, "Welcome to Working Model," Working Model website (www.workingmodel.com), retrieved Apr. 14, 2010.

* cited by examiner

*Primary Examiner* — Thai Phan
(74) *Attorney, Agent, or Firm* — Nelson Mullins Riley & Scarborough LLP

(57) ABSTRACT

In an embodiment, an element, that represents an entity in a system, is generated. The generated element may be incorporated in a network that represents the system. The generated element may include geometry information about a geometry of the entity. The geometry information may be used in one or more computations associated with a simulation or an analysis of the system. The element may have a frame port that exposes a frame. The frame may represent at least a position and an orientation in a two dimensional or three dimensional space with respect to another frame in the network. The other frame in the network may be a reference frame that may be defined by a "world" that the system resides in. The generated element may be incorporated into the network by connecting the frame port to the network.

18 Claims, 16 Drawing Sheets

REPRESENTING GEOMETRY OF A SYSTEM IN A MODELING ENVIRONMENT

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Figure 1:
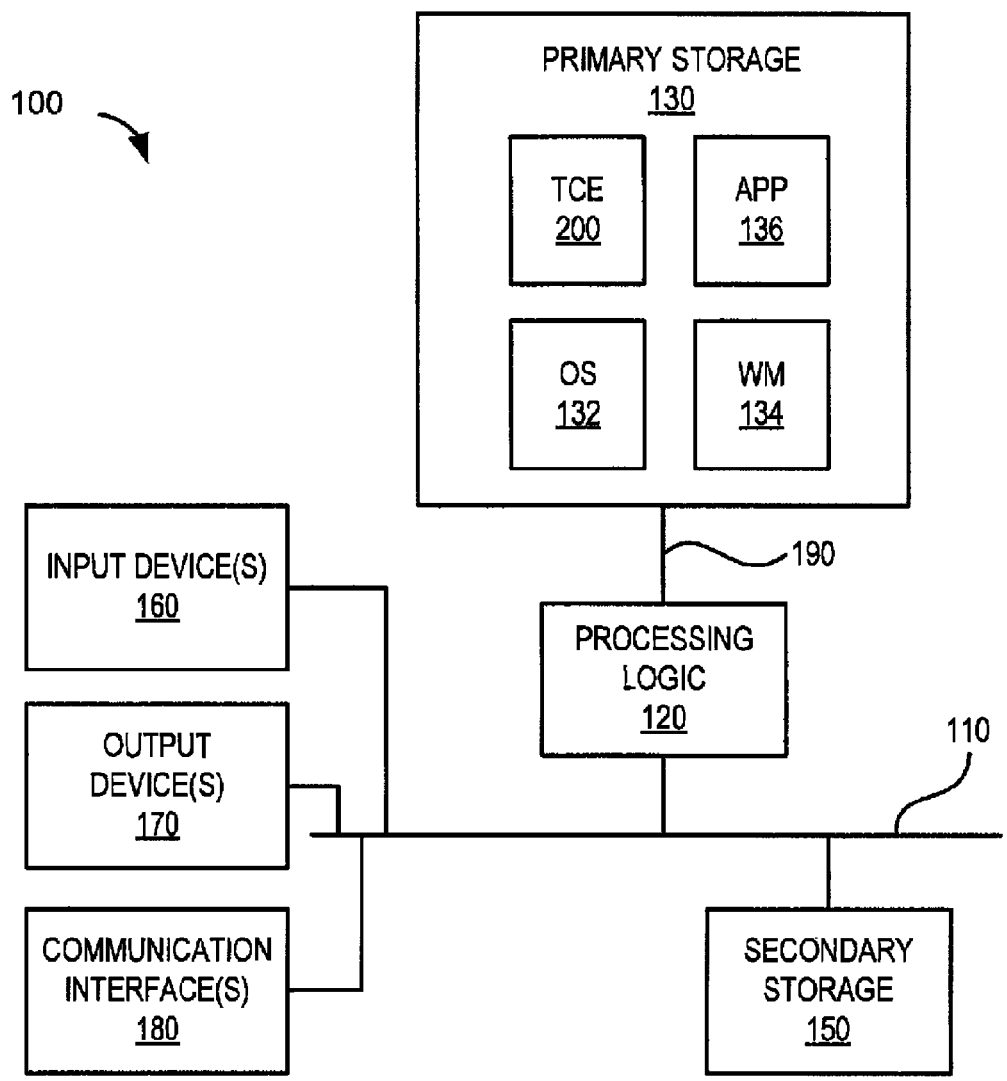
FIG. 1 illustrates a block diagram of an example of a computing device.

The following detailed description refers to the accompanying drawings. The same reference numbers in different drawings may identify the same or similar features illustrated in the drawings.

One or more embodiments of the invention may be implemented on one or more computing devices. The one or more computing devices may be a system or part of a system. The one or more computing devices may include, for example, a desktop computer, laptop computer, client computer, server computer, mainframe computer, personal digital assistant (PDA), netbook computer, tablet computer, web-enabled cellular telephone, smart phone, or some other computing device.

FIG. 1 illustrates an example of a computing device 100 that may be used with one or more embodiments of the invention. Referring to FIG. 1, the computing device 100 may include one or more components, such as processing logic 120, primary storage 130, secondary storage 150, one or more input devices 160, one or more output devices 170, and one or more communication interfaces 180, coupled together by one or more buses, such as input-output (I/O) bus 110 and memory bus 190. Note that computing device 100 is an example of a computing device that may implement one or more embodiments of the invention. Other computing devices that may be less complicated or more complicated than computing device 100 may implement one or more embodiments of the invention.

The I/O bus 110 may be an interconnect bus that enables communication between various components in the computing device 100, such as processing logic 120, secondary storage 150, input devices 160, output devices 170, and communication interfaces 180. The communication may include, among other things, transferring information (e.g., data, control information, executable instructions) between the components.

The memory bus 190 may be an interconnect bus that may enable information to be transferred between the processing logic 120 and the primary storage 130. The information may include instructions and/or data that may be executed, manipulated, and/or otherwise processed by processing logic 120. The instructions and/or data may include instructions and/or data that may implement one or more embodiments of the invention.

The processing logic 120 may include logic that may interpret, execute, and/or otherwise process information contained in, for example, the primary storage 130 and/or secondary storage 150. The information may include computer-executable instructions and/or data that may implement one or more embodiments of the invention. The processing logic 120 may comprise a variety of heterogeneous hardware. The hardware may include, for example, some combination of one or more processors, microprocessors, field programmable gate arrays (FPGAs), application specific instruction set processors (ASIPs), application specific integrated circuits (ASICs), complex programmable logic devices (CPLDs), graphics processing units (GPUs), or other types of processing logic that may interpret, execute, manipulate, and/or otherwise process the information. The processing logic 120 may comprise a single core or multiple cores. Moreover, processing logic 120 may comprise a system-on-chip (SoC) or system-in-package (SiP). An example of a processor that may be used to implement processing logic 120 is the Intel® Xeon® processor available from Intel Corporation, Santa Clara, Calif.

The secondary storage 150 may be a non-transient tangible computer-readable media that is accessible to the processing logic 120 via I/O bus 110. The secondary storage 150 may store information for the processing logic 120. The information may be executed, interpreted, manipulated, and/or otherwise processed by the processing logic 120. The secondary storage 150 may comprise, for example, a storage device, such as a magnetic disk, optical disk, random-access memory (RAM) disk, and/or flash drive. The information may be stored on one or more non-transient tangible computer-readable media contained in the storage device. This media may include, for example, magnetic discs, optical discs, and/or memory devices (e.g., flash memory devices, static RAM (SRAM) devices, dynamic RAM (DRAM) devices, or other memory devices). The information may include data and/or computer-executable instructions that may implement one or more embodiments of the invention.

Input devices 160 may include one or more devices that may be used to input information into computing device 100. Devices that may be used to input information into computing device 100 may include, for example, a keyboard (e.g., hardware keyboard, software keyboard), computer mouse, microphone, camera, trackball, gyroscopic device (e.g., gyroscope), mini-mouse, touch pad, stylus, graphics tablet, touch screen, joystick (isotonic or isometric), pointing stick, accelerometer, palm mouse, foot mouse, eyeball controlled device, finger mouse, light pen, light gun, neural device, eye tracking device, gesture tracking device, steering wheel, yoke, jog dial, space ball, directional pad, dance pad, soap mouse, haptic device, tactile device, neural device, multipoint input device, discrete pointing device, or some other input device. The information may include spatial (e.g., continuous, multi-dimensional) data that may be input into computing device 100, for example, using a device such as a computer mouse. The information may also include other forms of data, such as, for example, text that may be input using a keyboard.

Output devices 170 may include one or more devices that may output information from the computing device 100. Devices that may output information from the computing device 100 may include, for example, a cathode ray tube (CRT), plasma display device, light-emitting diode (LED) display device, liquid crystal display (LCD) device, vacuum florescent display (VFD) device, surface-conduction electron-emitter display (SED) device, field emission display (FED) device, haptic device, tactile device, neural stimulation device, printer (e.g., a three-dimensional (3D) printer, laser printer), speaker, video projector, volumetric display device, plotter, actuator (e.g., electrical motor) or some other output device. Output devices 170 may be directed by, for example, the processing logic 120, to output the information from the computing device 100. The information may be presented (e.g., displayed, printed) by output devices 170. The information may include, for example, graphical user interface (GUI) elements (e.g., windows, widgets, dialog boxes, or other GUI elements), graphical representations, pictures, text, or other information that may be presented by output devices 170. Note that the information may be presented on one or more output devices 170 in a stereoscopic view to enable, for example, a perception of depth.

Communication interfaces 180 may include one or more devices that contain logic configured to (1) interface the computing device 100 with, for example, one or more communication networks and (2) enable the computing device 100 to communicate with one or more devices connected to the communication networks. An example of a communication network that may be used with computing device 100 will be described further below with respect to FIG. 16.

Communication interfaces 180 may include one or more transceiver-like mechanisms that enable the computing device 100 to communicate with devices connected to the communication networks. Communication interfaces 180 may include a built-in network adapter, network interface card (NIC), Personal Computer Memory Card International Association (PCMCIA) network card, card bus network adapter, wireless network adapter, Universal Serial Bus (USB) network adapter, modem, or other device suitable for interfacing the computing device 100 to the communication networks.

The primary storage 130 is accessible to the processing logic 120 via bus 190. The primary storage 130 may be a non-transient tangible computer-readable media that may store information for processing logic 120. The information may include computer-executable instructions and/or data that may implement operating system (OS) 132, windows manager (WM) 134, an application 136 (APP), and a technical computing environment (TCE) 200. The instructions may be executed, interpreted, and/or otherwise processed by processing logic 120.

The primary storage 130 may comprise a RAM that may include RAM devices that may store the information. The RAM devices may be volatile or non-volatile and may include, for example, one or more DRAM devices, flash memory devices, SRAM devices, zero-capacitor RAM (ZRAM) devices, twin transistor RAM (TTRAM) devices, read-only memory (ROM) devices, ferroelectric RAM (Fe-RAM) devices, magneto-resistive RAM (MRAM) devices, phase change memory RAM (PRAM) devices, or other types of RAM devices.

OS 132 may be a conventional operating system that may implement various conventional operating system functions. These functions may include, for example, scheduling one or more portions of APP 136 and/or TCE 200 to run on the processing logic 120, managing the primary storage 130, controlling access to various components associated with the computing device 100 (e.g., secondary storage 150, input devices 160, output devices 170, communication interfaces 180), and controlling access to data received and/or transmitted by these components.

Examples of operating systems that may be used to implement OS 132 include, but are not limited to, the Linux operating system, Microsoft Windows operating system, the Symbian operating system, Mac OS, Chrome OS, and the Android operating system. A version of the Linux operating system that may be used is Red Hat Linux available from Red Hat Corporation, Raleigh, N.C. Versions of the Microsoft Windows operating system that may be used include Microsoft Windows 7, Microsoft Windows Vista, and Microsoft Windows XP operating systems available from Microsoft Inc., Redmond, Wash. The Chrome OS and Android operating systems are available from Google, Inc., Mountain View, Calif. The Mac OS operating system is available from Apple Inc., Cupertino, Calif. The Symbian operating system is available from the Symbian Foundation, London, United Kingdom.

WM 134 may be a conventional window manager that may manage GUI elements, such as widgets, dialog boxes, and windows, that may be part of the OS 132, TCE 200, and APP 136. The GUI elements may be displayed on an output device 170. The WM 134 may also be configured to (1) capture one or more positions of interactions with input devices 160 and/or other data associated with the input devices 160, and (2) provide the positions and/or data to, for example, OS 132, APP 136, and/or TCE 200. The positions and/or data may be provided in messages that are sent to the OS 132, APP 136, and/or TCE 200. Examples of window managers that may be used to implement WM 134 may include, but are not limited to, X windows, GNOME, and KDE, which are often used with the Linux operating system, and window managers used with the Microsoft Windows XP, Microsoft Windows Vista, and Microsoft Windows 7 operating systems. It should be noted that other window managers or components that implement various functions associated with window managers may be used to implement WM 134.

APP 136 may be designed to perform a particular task or tasks. APP 136 may be an executable and/or interpretable version of a software application that may be written in a programming language, such as C, C++, or some other programming language. Some or all of APP 136 may be written by a user of computing device 100, supplied by a vendor, or generated by TCE 200. Some or all of APP 136 may operate under the control of OS 132. APP 136 may include computer-executable instructions and/or data that may implement one or more embodiments of the invention.

TCE 200 may be a modeling environment, such as a graphical modeling environment or textual modeling environment, that may enable modeling of various systems, such as, for example, mechanical systems, electrical systems, and/or electro-mechanical systems. TCE 200 may include tools to build and simulate networks that represent one or more systems. The networks may comprise one or more elements that may represent bodies, joints, constraints, and forces of the systems.

TCE 200 may automatically generate two dimensional (2-D) and/or three dimensional (3-D) visualizations of the networks. The visualizations may be animated during simulation to enable visualization of dynamics associated with the systems represented by the networks. Moreover, the visualizations may be stereoscopic. Here, differences in viewpoint may be generated from a certain vantage point. TCE 200 may also contain provisions for generating code (e.g., C code) based on the networks to enable, for example, use of accelerator modes during simulation. Also, TCE 200 may contain provisions for generating layout and/or manufacturing information (e.g., machining data, STEP-NC code) based on a system's design. Some or all of TCE 200 may operate under the control of OS 132. TCE 200 may include computer-executable instructions and/or data that may implement one or more embodiments of the invention.

Figure 2:
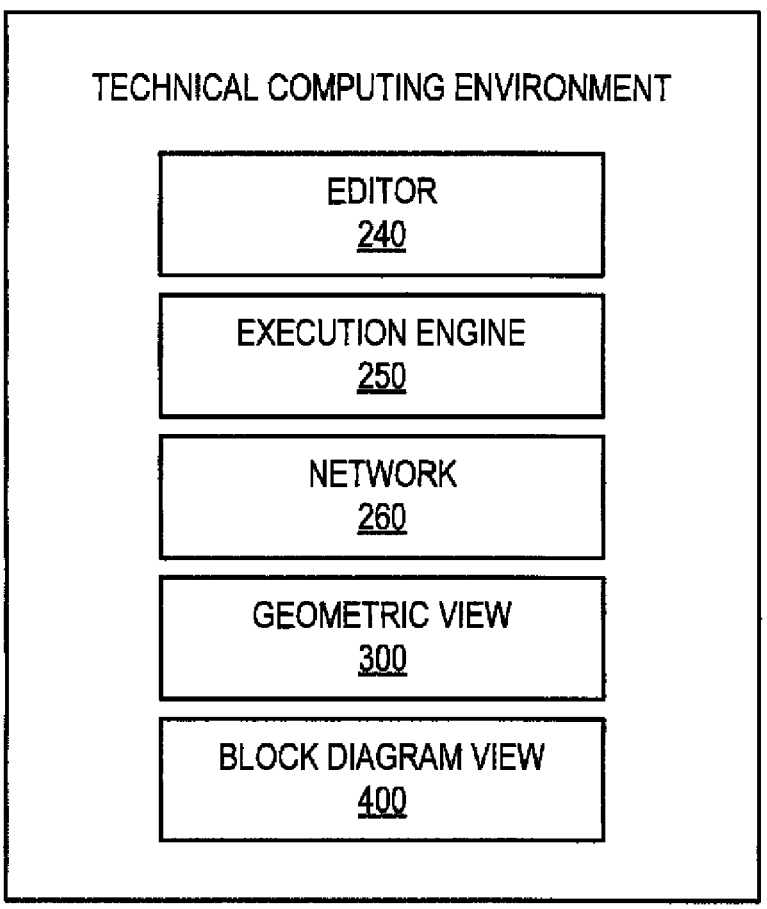
FIG. 2 illustrates a block diagram of an example of a technical computing environment (TCE)

FIG. 2 illustrates an example embodiment of TCE 200. Referring to FIG. 2, TCE 200 may comprise various components, which may include an editor 240, an execution engine 250, a network 260, a geometric view 300, and a block diagram view 400. Note that FIG. 2 illustrates an example embodiment of TCE 200. Other embodiments of TCE 200 may contain, for example, more components or fewer components than the components illustrated in FIG. 2. Moreover, functions performed by the various components contained in TCE 200 may be distributed among the components differently than described below in other embodiments of TCE 200.

The TCE 200 may include hardware-based and/or software-based logic, which may provide a computing environment that may allow various tasks, related to various disciplines, such as mathematics, science, engineering, mechanics, physics, medicine, business, biology, and/or finance, to be performed. The TCE 200 may include a dynamically-typed programming language (e.g., the MATLAB® language), where a data type of data may be determined at runtime.

The dynamically typed programming language may use an array as a basic data element where the array may not require dimensioning. The array may be used to support array-based programming where an operation may apply to an entire set of values included in the array. Array-based programming may allow array-based operations to be treated as a high-level programming technique that may allow, for example, operations to be performed on entire aggregations of data without having to resort to explicit loops of individual non-array operations.

In addition, the TCE 200 may perform matrix and/or vector formulations that may be used for data analysis, data visualization, application development, simulation, modeling, and/or algorithm development. These matrix and/or vector formulations may be used in many areas, such as mathematics, science, engineering, mechanics, physics, medicine, business, biology, and/or finance.

The TCE 200 may further provide functions and/or tools for generating, for example, plots, surfaces, images, volumetric representations, or other representations. The TCE 200 may provide these functions and/or tools using toolboxes (e.g., toolboxes for signal processing, image processing, data plotting, and/or parallel processing). In addition, the TCE 200 may provide these functions as block sets. The TCE 200 may also provide these functions in other ways, such as via a library or a database.

The TCE 200 may include provisions for generating network 260 and using network 260 to simulate a system that is represented by network 260. Network 260 may contain one or more elements. An element may represent an entity (e.g., a part) associated with the system. For example, the system main contain a mechanical joint. The mechanical joint may be represented in a network as an element. An element may include information associated with the entity. For example, a mechanical joint represented by an element may include information about the mechanical joint, such as geometric, mass, and tensor information (e.g., inertia tensor, strain tensor, stress tensor, elasticity tensor) about the mechanical joint.

Network 260 may be graphically represented as a block diagram that is provided in block diagram view 400 by TCE 200. An element of network 260 may be graphically represented as a block in the block diagram. A multidimensional geometric visualization (e.g., 2-D visualization, 3-D visualization) of network 260 may be provided by TCE 200 in geometric view 300. Additional details of block diagram view 400 and geometric view 300 will be discussed further below.

TCE 200 may contain computer-executable instructions and data that may perform various tasks, such as, for example, (1) constructing network 260 through an interface, such as a GUI and/or a text-based interface; (2) allowing an augmentation of a pre-defined set of elements contained in network 260 with custom user-specified elements; (3) using network 260 to simulate the system represented by network 260; and (4) automatically producing, for example, deployable software systems, and/or descriptions of hardware systems that may mimic a behavior of either the entire network 260 or portions of the network 260. These deployable software systems and/or descriptions of hardware systems may allow the system to be simulated in, for example, a distributed computing environment.

Examples of TCEs that may be adapted to implement one or more embodiments of the invention may include, but are not limited to, Simulink®, Stateflow®, Simscape™, SimMechanics™, and SimEvents®, which are available from MathWorks, Inc.; Unified Modeling Language (UML); profiles associated with UML (e.g., Modeling Analysis and Real-Time Embedded Systems (MARTE), Systems Modeling Language (SysML), Avionics Architecture Description Language (AADL)); GNU Octave from the GNU Project; MATRIXx and LabView® from National Instruments; Mathematica from Wolfram Research, Inc.; Mathcad from Mathsoft Engineering & Education Inc.; Maple from Maplesoft; Extend from Imagine That, Inc.; Scilab and Scicos from The French Institution for Research in Computer Science and Control (INRIA); Modelica or Dymola from Dynasim AB; VisSim from Visual Solutions; SoftWIRE from Measurement Computing Corporation; WiT from DALSA Coreco; Advanced Design System, VEE Pro, and SystemVue from Agilent Technologies, Inc.; Vision Program Manager from PPT Vision, Inc.; Khoros from Khoral Research, Inc.; VisiQuest from Pegasus Imaging Corporation; Gedae from Gedae, Inc.; Virtuoso from Cadence Design Systems, Inc.; Rational Rose, Rhapsody, and Tau from International Business Machines (IBM), Inc.; SCADE from Esterel Technologies; Working Model 2D from Design Simulation Technologies, Inc.; Working Model from Design Simulation Technologies, Inc.; Computer Aided Three-dimensional Interactive Application (CATIA) and SolidWorks from Dassault Systems; and Ptolemy from the University of California at Berkeley.

Editor 240 may be a block diagram editor that may allow, for example, a user, to specify, edit, annotate, save, publish, and/or print a block diagram or visualization of network 260. For example, a block diagram of network 260 may be presented in the block diagram view 400 and editor 240 may contain one or more provisions for specifying, editing, annotating, saving, publishing, and/or printing the block diagram in the block diagram view 400. Likewise, for example, a visualization of network 260 may be presented in the geometric view 300 and editor 240 may contain one or more provisions for specifying, editing, annotating, saving, publishing, and/or printing the visualization in the geometric view 400. In addition, editor 240 may contain one or more provisions for editing code (e.g., source code), requirements, and/or tests that may be generated from or otherwise associated with network 260. Moreover, editor 240 may contain one or more provisions for specifying one or more entities contained in the system represented by network 260. The entities may be specified graphically and/or textually.

The execution engine 250 may use network 260 to simulate some or all of the system represented by network 260. The simulation may include performing various computations, associated with the system, based on information (e.g., geometry information) associated with one or more elements contained in network 260. The computations may include, but are not limited to, computations of dynamics, statics, equilibrium, mass, inertia, collision detection, collision response, and/or force fields associated with the system.

Figure 3:
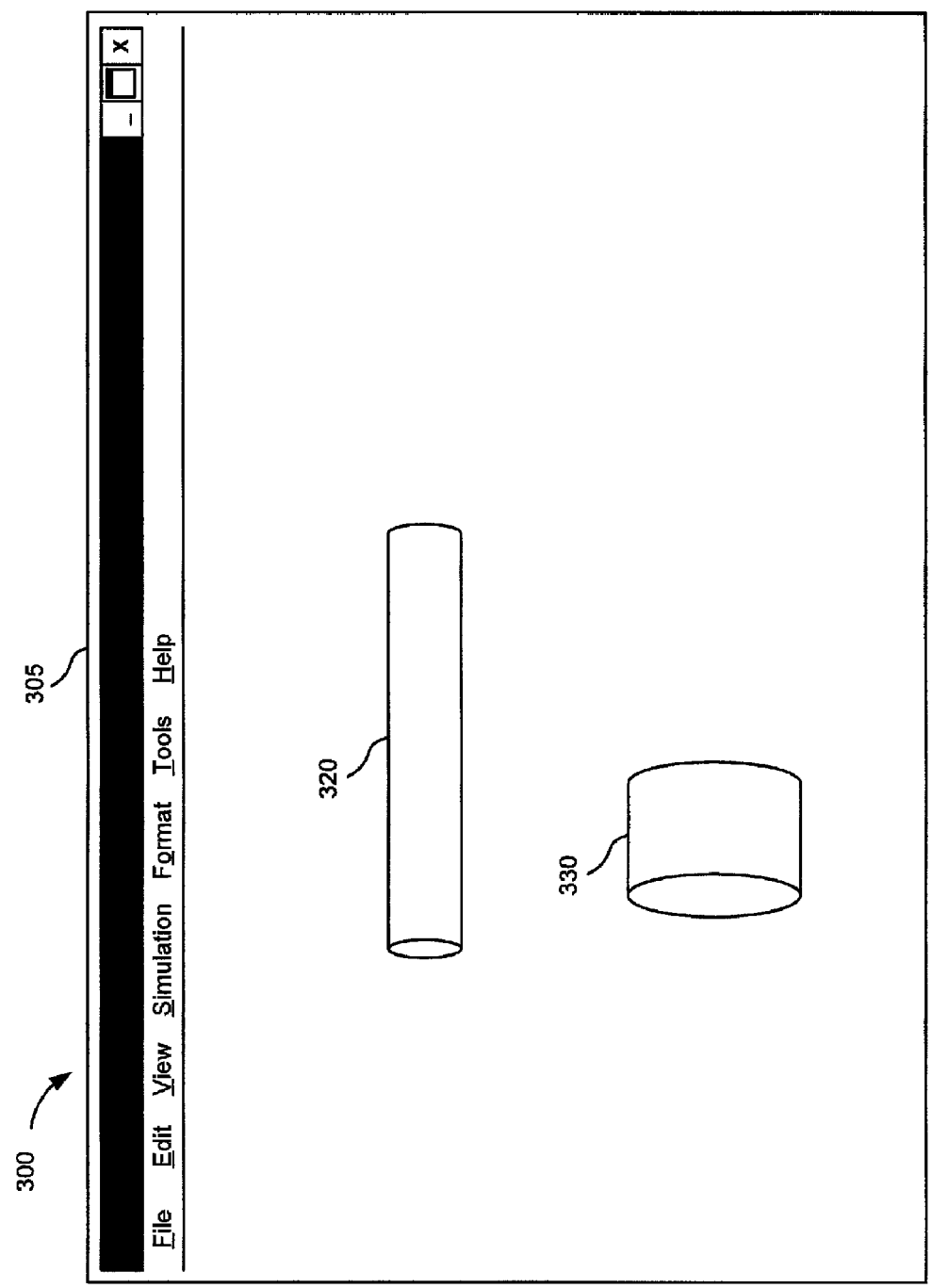
FIG. 3 illustrates an example geometric view of a visualization of a network that represents a system containing a first cylinder and a second cylinder.

As noted above, geometric view 300 may provide a multi-dimensional visualization of a network. FIG. 3 illustrates an example geometric view 300 that may provide a 3-D geometric visualization of an example embodiment of network 260. Referring to FIG. 3, geometric view 300 may be presented in a GUI that includes a graphical window 305. The GUI may be provided by TCE 200. The window 305 may be displayed on an output device 170.

The visualization may include one or more graphical objects that may visualize one or more elements contained in the above embodiment of network 260. In this example, the embodiment of network 260 contains a first cylinder element and a second cylinder element. The first cylinder element and the second cylinder element may be visualized in the geometric view as cylinder object 320 and cylinder object 330, respectively. Note that in FIG. 3, cylinder objects 320 and 330 are presented in the geometric view 300 as 3-D objects. It should be noted, however, that one or more elements of a network, may be visualized in geometric view 300 as objects having other numbers of dimensions. For example, cylinders 320 and/or 330 may be presented in the geometric view 300 as 2-D objects. Also note that the orientation and position of the graphical objects 320, 330 as depicted in the geometric view 300 may be based on one or more frames associated with the objects 320, 330. The frames may represent one or more positions and orientations that may be based on, for example, a position and orientation represented by a reference frame. More information about frames and reference frames will be discussed further below.

Figure 4:
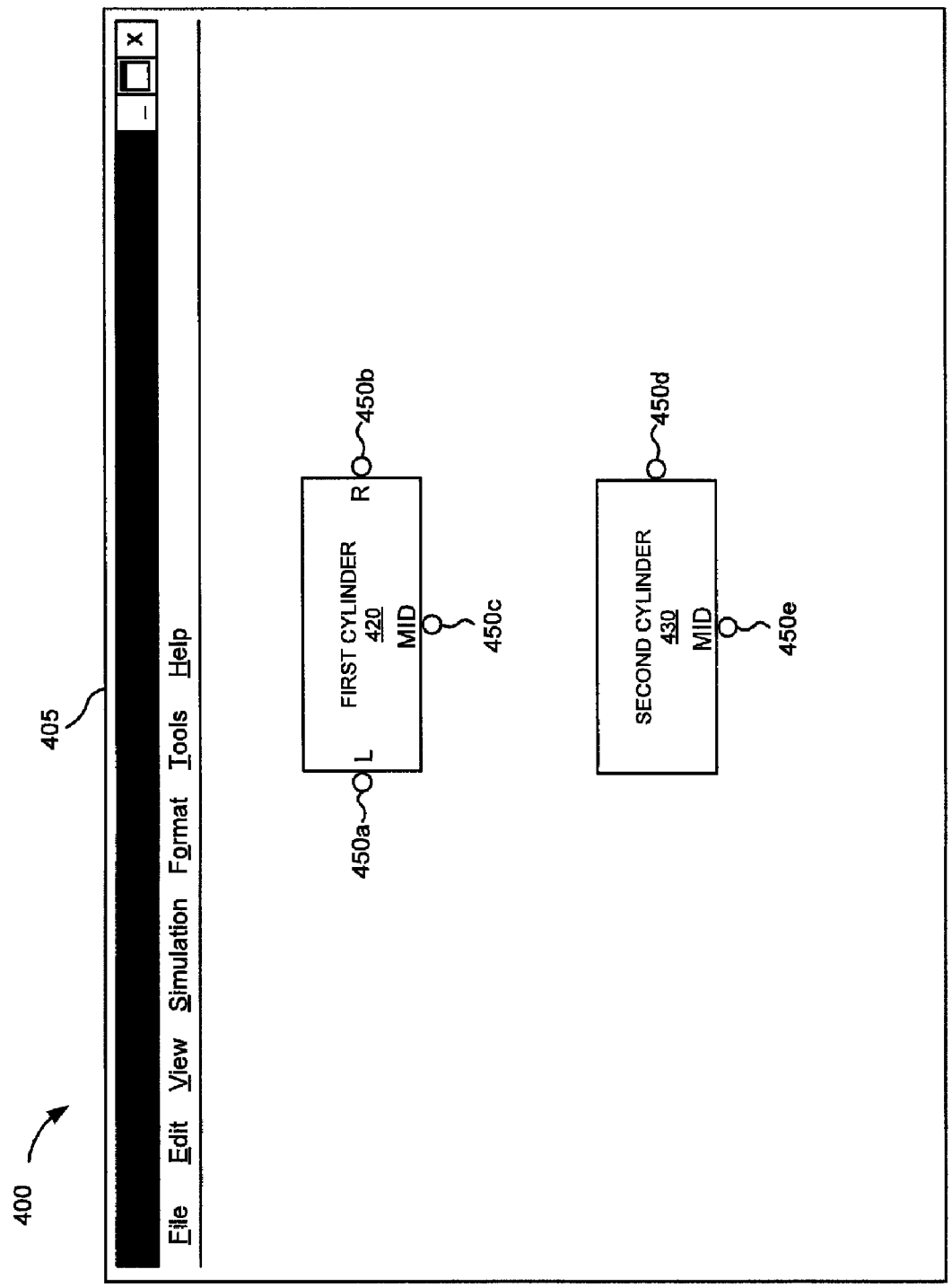
FIG. 4 illustrates an example block diagram view of a network that represents the system illustrated in FIG. 3.

FIG. 4 illustrates an example block diagram view 400 of the above example embodiment of network 260. Referring to FIG. 4, the block diagram view 400 may be presented in a GUI that includes a graphical window 405. The block diagram view 400 may depict various blocks including cylinder block 420 and cylinder block 430, which may represent the first cylinder element and the second cylinder element in the network 260, respectively.

An element may include one or more frame ports that may be used to expose one or more frames associated with the element. For example, first cylinder block 420 indicates that the first cylinder element contains three frame ports. The frame ports are illustrated as ports 450*a-c*. The frame ports may expose frames that may represent positions and orientations associated with a left-hand side, a right hand side, and a middle of the first cylinder. Moreover, a frame port may be used to expose a derivative of a position and orientation represented by a frame. For example, a frame port may expose a velocity and angular velocity that may be derived from a position and orientation, respectively, that may be associated with a frame.

A frame exposed by a frame port may represent at least a position and an orientation in a 2-D space (e.g., a space that has an x-axis and a y-axis) or 3-D space (e.g., a space that has an x-axis, a y-axis, and a z-axis) with respect to a position and orientation represented by a reference frame for a network. Moreover, a frame exposed by a frame port may represent a position and an orientation in a 2-D space or 3-D space with respect to a position and orientation represented by another frame in the network. Exposing the frame may include making one or more values that represent the position and orientation available to, for example, other elements in the network 260.

A position and orientation represented by a frame may be defined by one or more variables. For example, one or more parameters associated with an element may be used to define one or more geometric features of an entity (e.g., length and/or width of the entity) represented by the element. The parameters may be variables in that they may be changed. The parameters may be used along with a reference frame to identify a position and orientation represented by a frame that is exposed by a frame port of the element.

It should be noted that a frame exposed by a frame port of an element need not lie within the geometry of an entity represented by the element. Thus, for example, a frame, exposed by a frame port associated with the first cylinder element, may represent a position and orientation that lies outside the geometry of the first cylinder. Likewise, a frame, exposed by a frame port associated with the second cylinder element, may represent a position and orientation that lies outside the geometry of the second cylinder.

One or more geometric features of an entity along with the reference frame may be used to identify a position and orientation represented by a frame. In addition, a position and orientation represented by a frame may be identified based on one or more terms of higher-level operations on geometric features of the entity. For example, a position and orientation represented by a frame may be defined in part based on a projection of a particular point feature onto a particular plane feature of the entity. Likewise, for example, a z-axis of a frame, that represents a position and an orientation in 3-D space, may be defined in part as a normalized cross product of two edge features of the entity.

A position and orientation represented by a frame may be automatically adjusted if a feature of the entity, on which the position and orientation may depend, changes. For example, an element in a network 260 may represent a particular entity in a system. The element may include one or more parameters that represent one or more geometric features of the entity, such as, for example, a radius of the entity, a circumference of the entity, a length of the entity, a width of the entity, and/or one or more control points that define a curve of the entity. The position and orientation represented by a frame associated with the entity may change based on a change made to the one or more parameters.

Moreover, a language may be used to specify a higher-level geometric operation that may be used to identify a position and orientation represented by a frame. Here, the use of variable names in defining parameters used to identify a position and orientation represented by a frame may be one form of language that may be used. Operations specified by the language may involve, for example, identifying a normal component and/or tangential component of a vector at a point on a curve, and/or constructive solid geometry (CSG) techniques, such as finding unions and/or intersections of shapes. Note that the above techniques may be used to identify frames and/or frame relationships.

It should be noted that a network may represent a system in ways other than a block diagram. For example, the network may represent a system as a graph that may have one or more vertices and one or more edges. Here, the vertices may represent one or more elements in the network and the one or more edges may represent one or more frames in the network.

Figure 5:
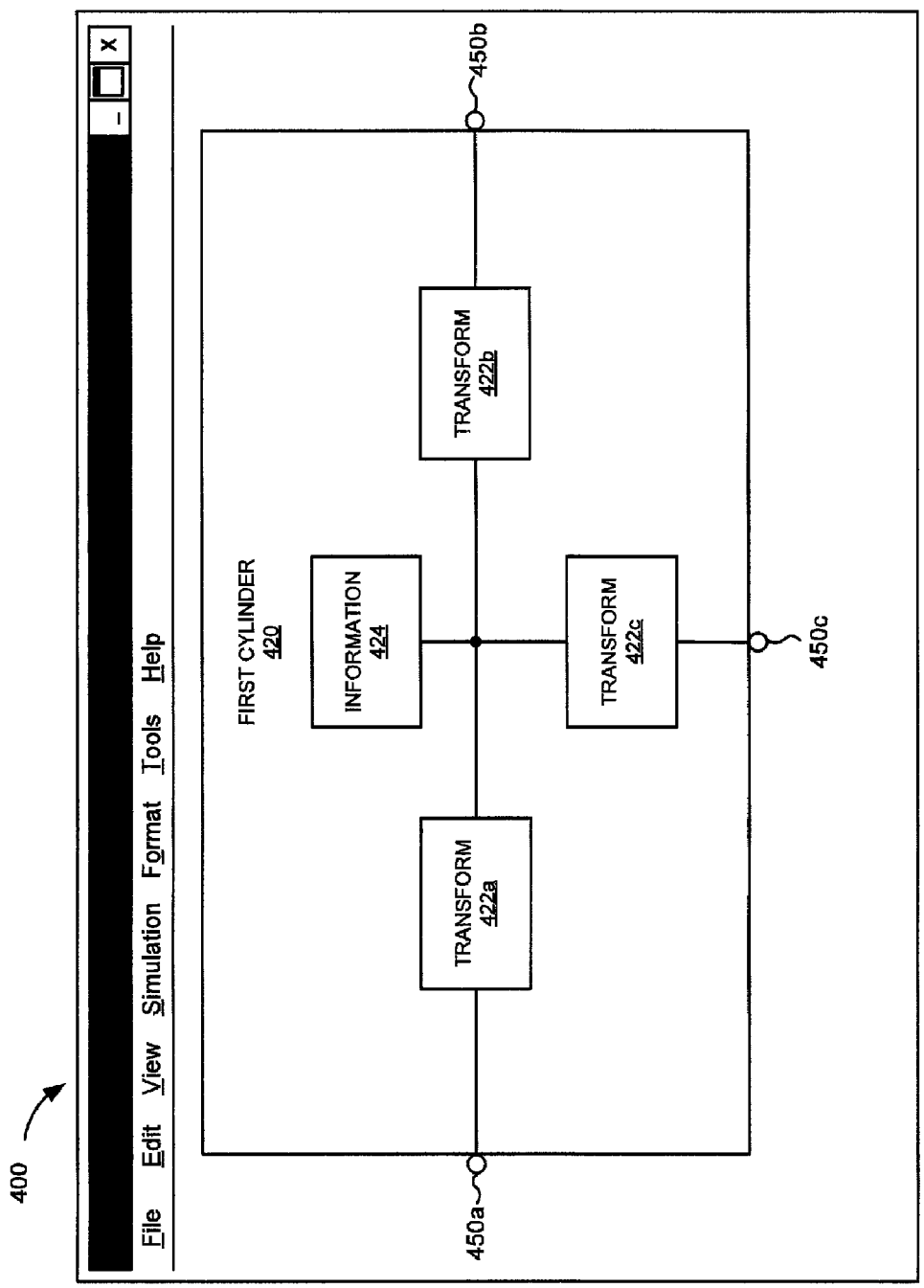
FIG. 5 illustrates an example block diagram view of an embodiment of a first cylinder element that represents the first cylinder in the system illustrated in FIG. 3.

FIG. 5 illustrates an example block diagram view 400 of an example embodiment of the first cylinder element represented by block 420. Referring to FIG. 5, the first cylinder element may contain transform elements and an information element that are represented in the block diagram by blocks 422a-c and block 424, respectively. The information element may contain information about the first cylinder that may be specified as one or more parameters associated with the information element. The information may include geometry information of the first cylinder and/or other information of the first cylinder. For example, the information may include a height of the first cylinder, a radius of a side of the first cylinder, an area of the first cylinder, a density of the first cylinder, a volume of the first cylinder, a circumference of the first cylinder, a length of the first cylinder, a width of the first cylinder, and/or one or more control points that define a curve of the first cylinder. Moreover, at least a portion of a geometry of the entity specified in the geometry information may include a lower-level representation of the entity. For example, the lower-level representation may include numerical coordinates that may define the portion of the geometry of the entity. Some or all of the information contained in the information element may be acquired, for example, from a file, a communications network, and/or a user interface.

The transform elements may use information (e.g., geometry information) contained in information element and/or other information (e.g., a position and orientation represented by a reference frame, a position and orientation of a frame exposed by a frame port of another element) to identify one or more frames associated with the element. The information may be transformed using one or more functions associated with the transform elements. Moreover, the transform elements may be associated with (e.g., contain) information (e.g., parameters) that may be used to identify the one or more frames. For example, a transform element may contain information that may identify a frame that is located 3 inches further along a positive x-axis than another frame, and rotated 45 degrees about a z-axis relative to the other frame. These parameter (i.e., 3 inches, x-axis; 45 degrees, z-axis) may be stored within the transform element. Frames identified by transform elements may be exposed via frame ports.

For example, a transform element represented by block 422c may include a function that may use geometry information of the first cylinder, contained in information element represented by block 424, along with a position and orientation represented by a frame (e.g., reference frame, another frame) in the network to identify a frame. The identified frame may represent a position and orientation that may be associated with the middle of the first cylinder with respect to the reference frame. The frame may be exposed through a frame port represented by port 450c in the block diagram.

It should be noted that identifying a frame, exposed by one or more frames ports of an element in a network, need not involve transforming information. For example, a frame may be identified by the element based on (1) a reference frame and/or a frame exposed by another element in the network, and/or (2) information (e.g., geometry information) contained in the element. Here, the information used to identify the frame (i.e., the reference frame and/or frame exposed by the other element and, the information in the element) need not necessarily be transformed in order to identify the frame. Thus, a transformation element may not be involved in identifying the frame.

Figure 6:
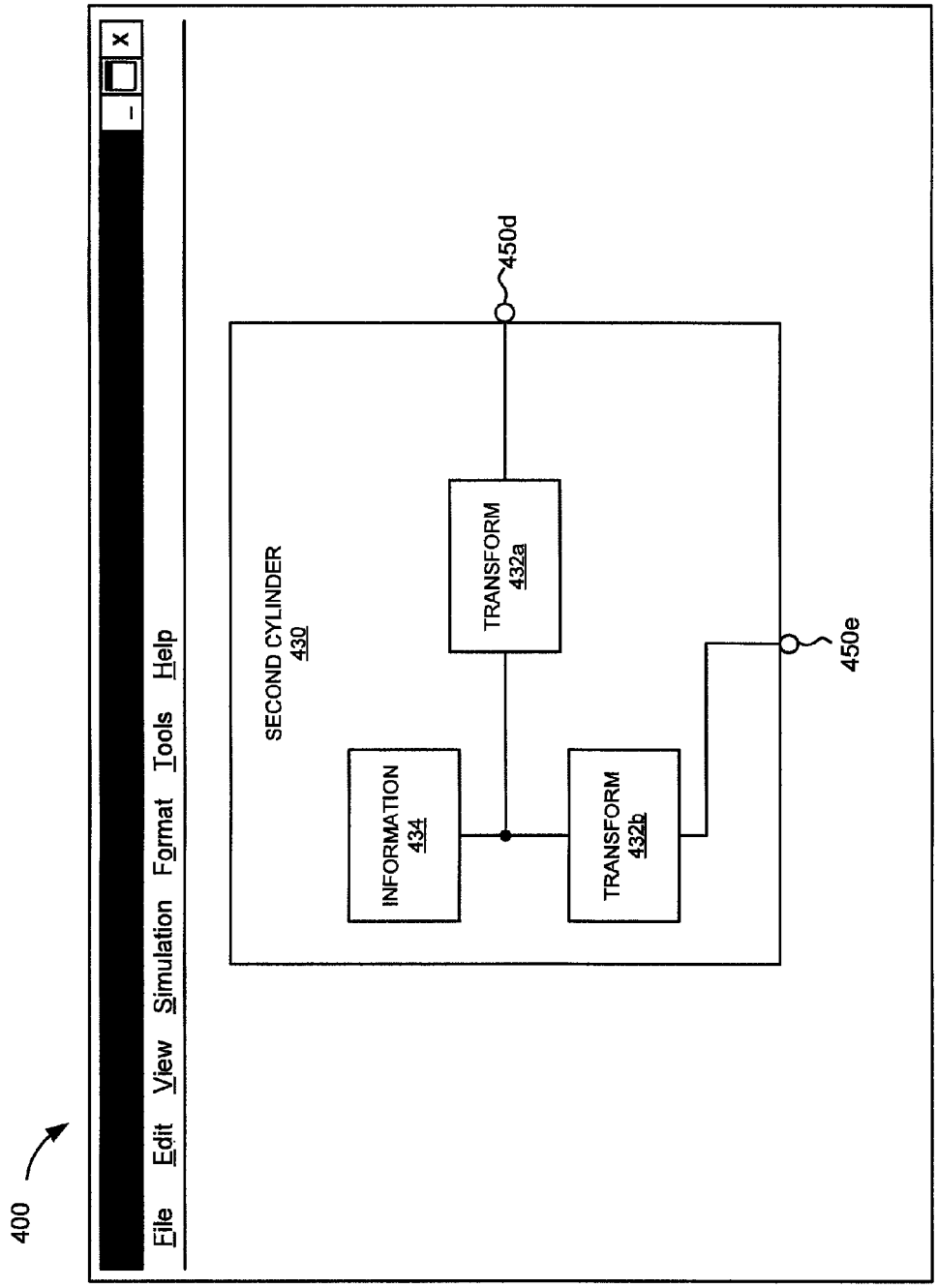
FIG. 6 illustrates an example block diagram view of an embodiment of a second cylinder element that represents the second cylinder in the system illustrated in FIG. 3.

FIG. 6 illustrates an example block diagram of an embodiment of the second cylinder element represented by block 430. Referring to FIG. 6, second cylinder element may comprise one or more transform elements, represented by blocks 432a-b, and an information element, represented by block 434. The information element may contain information (e.g., geometry information) about the second cylinder.

The transform elements may use information contained in the information element and/or position and orientation information associated with a frame (e.g., reference frame, another frame) in the network to identify one or more frames, as described above. The identified frames may be exposed via frame ports, such as the frame ports illustrated in the block diagram as ports 450d-e.

For example, the transform element represented by block 432a may include a function that may use geometry information of the second cylinder that may be contained in the information element, represented by block 434, along with information associated with the reference frame (e.g., a position and orientation represented by the reference frame) to identify a frame. The identified frame may represent a position and orientation that may be associated with the middle of the second cylinder with respect to the position and orientation represented by the reference frame. The frame may be exposed through the frame port represented by frame port 450d.

Figure 7:
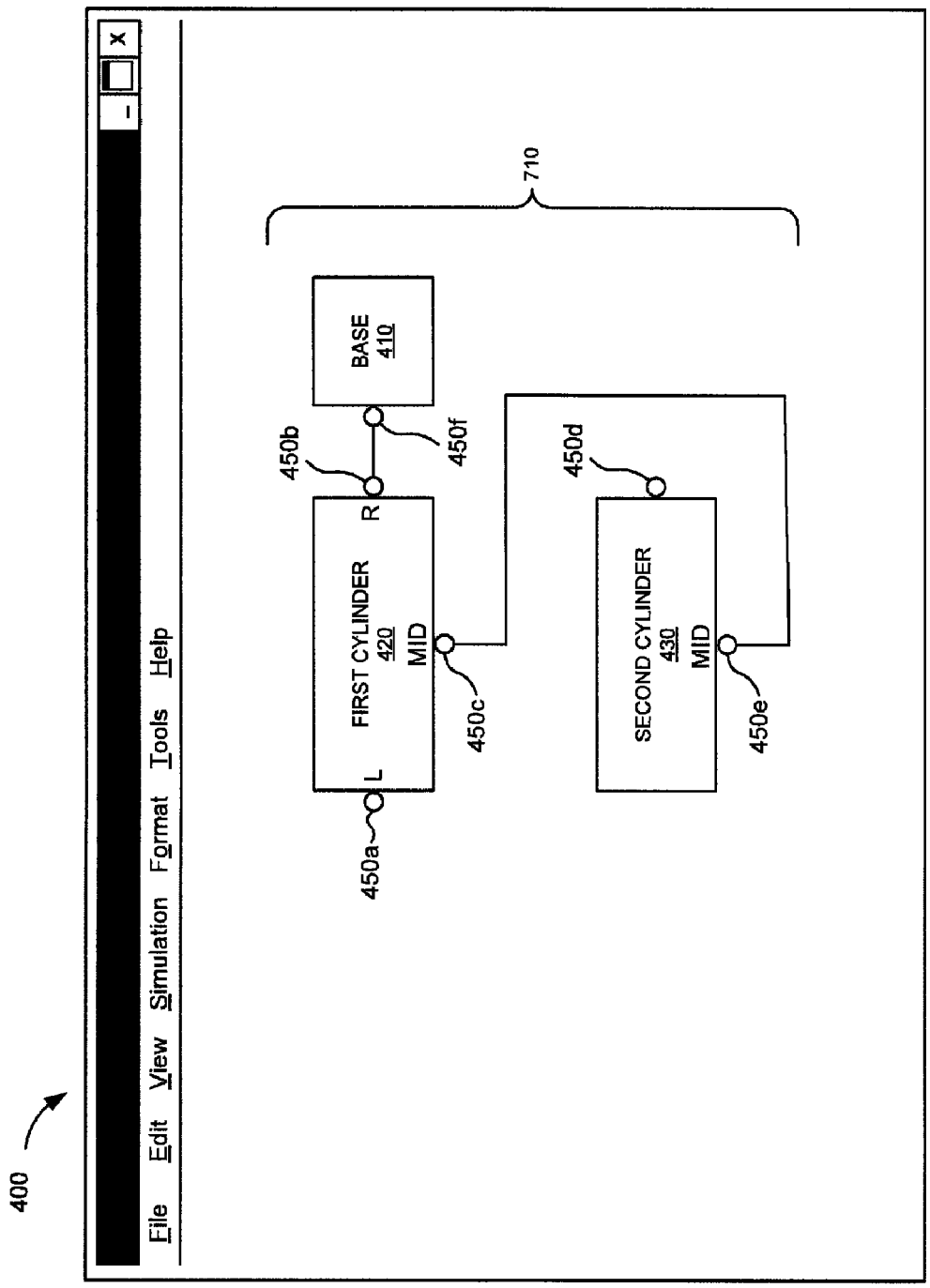
FIG. 7 illustrates an example block diagram view of a network that represents a system having a first cylinder, a second cylinder, and a base.

FIG. 7 illustrates an example block diagram view 400 of a network 710 that represents a system having the following entities: a first cylinder, a second cylinder, and a base. The network 710 may be an embodiment of network 260. The base entity in the system may be a base for the system. The base may be fixed at rest in an absolute global inertial reference frame defined by a "world" that the system resides in. Here, the base may be referred to as a "ground" for the system.

"World" may refer to a kinematic and geometric construct that may define an absolute global inertial reference frame and an absolute coordinate system. The absolute coordinate system may have a fixed origin and fixed coordinate axes that may not be changeable. The coordinate axes may be defined in three dimensions, such that "+x" points in a rightward direction from an origin of the absolute coordinate system, "+y" points in an upward direction for the origin (gravity in "−y" direction), and "+z" points in an outward direction from the origin. Note that the origin may be an origin of the system.

Referring now to FIG. 7, the network 710 may include a base element, first cylinder element, and a second cylinder element that represent the base, the first cylinder, and the second cylinder of the system, respectively. These elements are represented in the block diagram as base block 410, first cylinder block 420, and second cylinder block 430, respectively.

The base block 410 indicates that the base element contains a frame port, which is represented in the block diagram as port 450*f*. The frame port for the base element may expose a frame where the base attaches to the first cylinder. This frame may be based on an absolute global inertial reference frame for the system. Likewise, the first cylinder block 420 indicates that the first cylinder element includes three frame ports. These ports are represented in the block diagram as ports 450*a-c*. The second cylinder block 430 indicates that the second cylinder element contains two frame ports. These frame ports are represented in the block diagram as ports 450*d-e*. The block diagram also shows that the frame port of the base element, represented by port 450*f*, connects the base element to the first cylinder at a first frame port of the first cylinder represented by port 450*b*. In addition, the block diagram shows that a second frame port of the first cylinder element, represented by port 450*c*, connects to a frame port of the second cylinder element, represented by 450*e*.

Note that positions and orientations of frames in network 710, which are exposed by the frame ports, may be identified (e.g., generated) based on a position and orientation of a frame in the network 710 (e.g., the absolute global inertial reference frame for the network 710, a frame exposed by an element in the network 710) and/or geometry information contained in the elements associated with the frame ports. For example, the position and orientation of the frame exposed by the frame port represented by port 450*e* may be identified (e.g., generated) by the transform element represented by block 432*b* (FIG. 6) based on geometry information of the second cylinder contained in information element, represented by block 434, and the absolute global inertial reference frame exposed by the frame port represented by port 450*f*. Likewise, for example, the position and orientation of the frame exposed by port 450*e* may be identified based on geometry information of the second cylinder contained in the information element, represented by block 434, and the frame exposed by port 450*c*.

Note that two frame ports that are connected may expose frames that have the same position and orientation. Thus, for example, the position and orientation of the frame exposed by port 450*b* may be the same as the position and orientation of the frame exposed by port 450*f* since, in network 710, port 450*b* is connected to port 450*f*.

Figure 8:
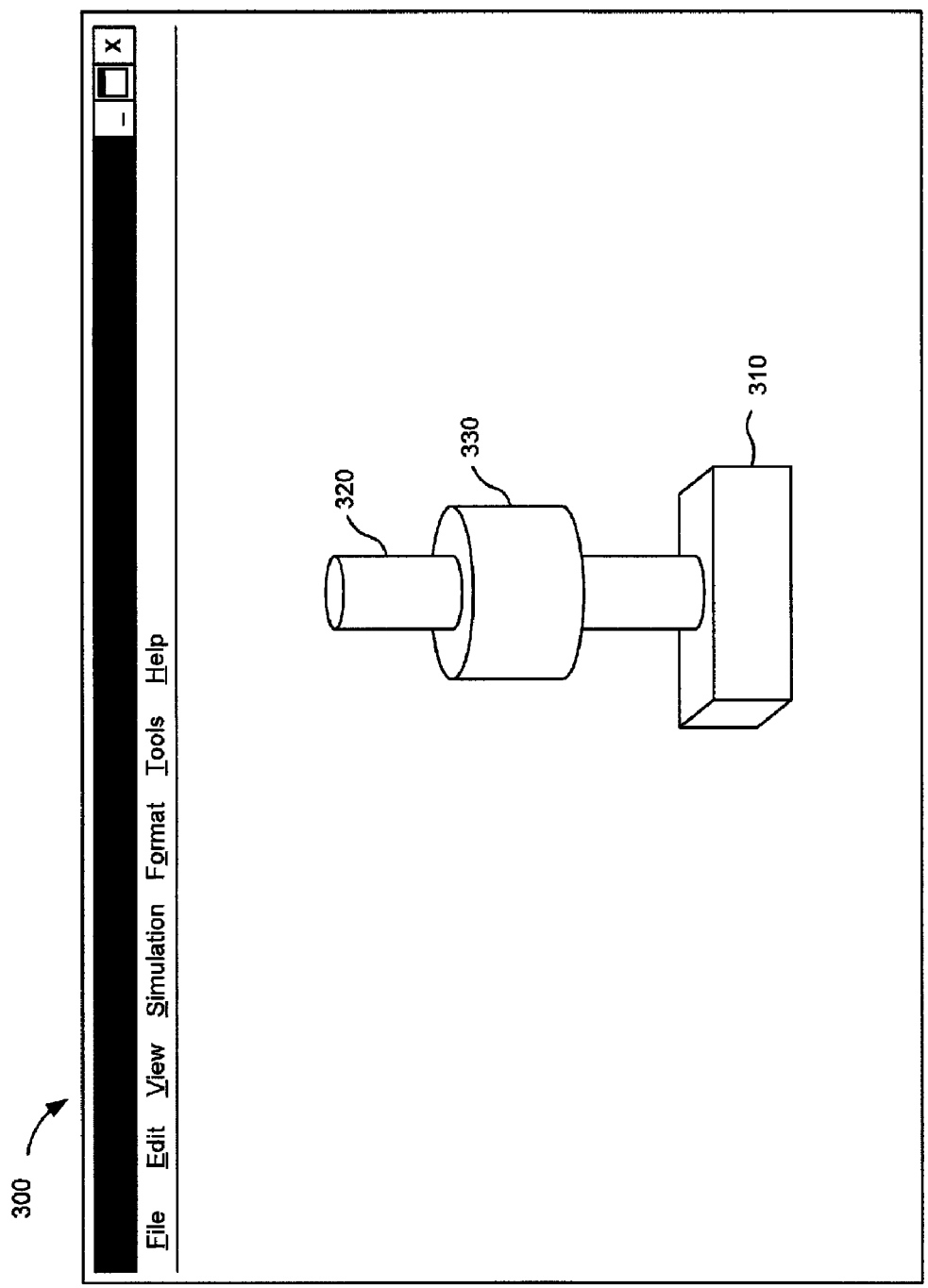
FIG. 8 illustrates an example geometric view that provides a visualization of the network illustrated in FIG. 7.

FIG. 8 illustrates an example of a geometric view 300 that may provide a visualization of network 710. Referring to FIG. 8, the geometric view 300 may include a 3-D visualization of the base element, first cylinder element, and second cylinder element of network 710. In the 3-D visualization, the base element, first cylinder element, and second cylinder element may be visualized as base object 310, cylinder object 320, and cylinder object 330, respectively.

Figure 9:
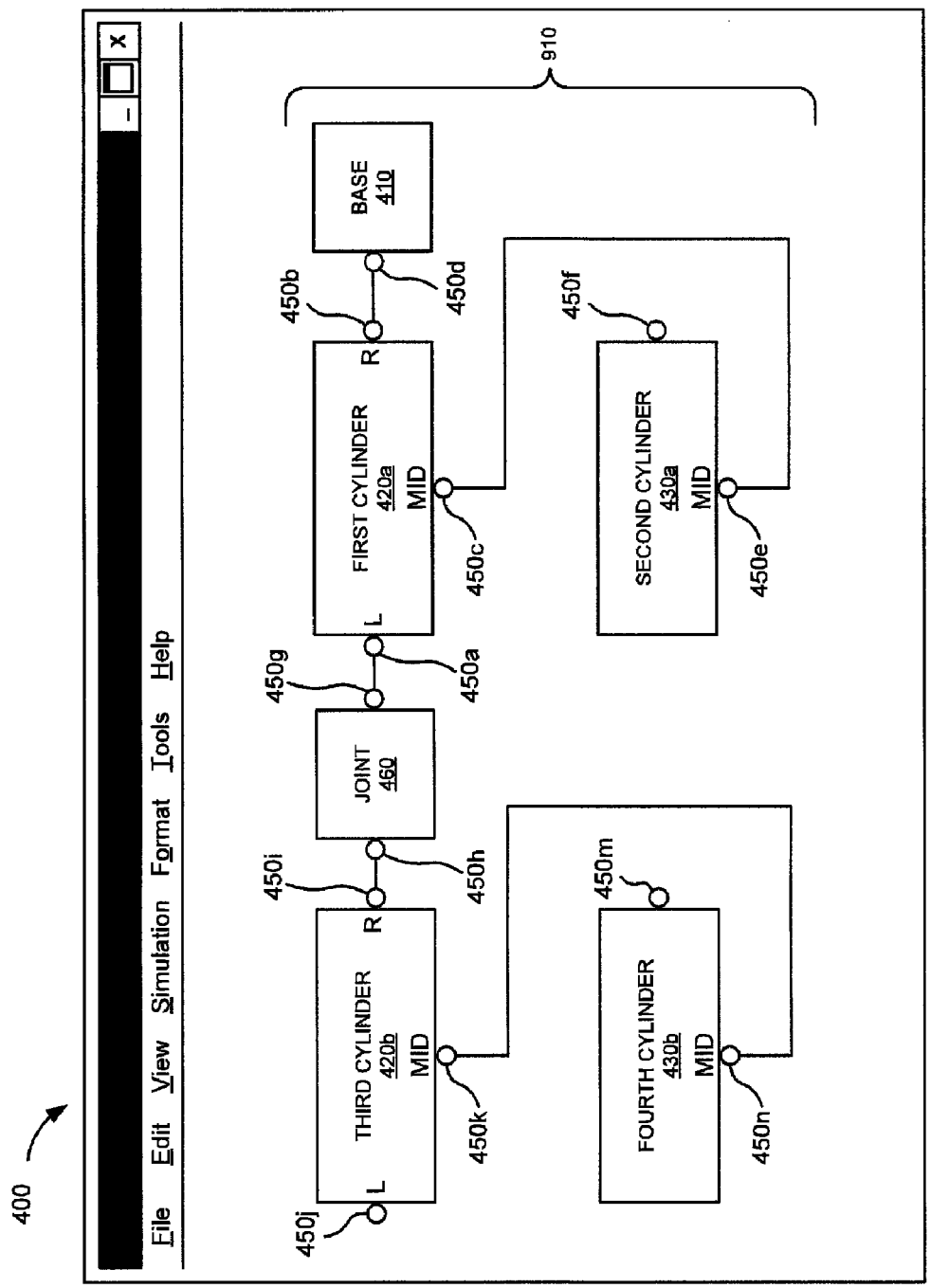
FIG. 9 illustrates an example block diagram view of a network that represents a system containing a base, a first cylinder, a second cylinder, a joint, a third cylinder, and a fourth cylinder.

FIG. 9 illustrates an example block diagram view 400 of a network 910 of a system having a base, first cylinder, second cylinder, joint, third cylinder, and fourth cylinder. The network 910 may be an embodiment of network 260. The system represented by network 910 may build on the system represented by network 710.

Referring to FIG. 9, the network 910 may include a base element, a first cylinder element, a second cylinder element, a joint element, a third cylinder element, and a fourth cylinder element that represent the base, first cylinder, second cylinder, joint, third cylinder, and fourth cylinder in the system. The elements are represented in a block diagram of the network 910 by blocks 410, 420*a*, 430*a*, 460, 420*b*, and 430*b*, respectively. Blocks 410, 420*a*, and 430*a*, are similar to blocks 410, 420, and 430, respectively, that were described above with respect to FIG. 7.

The joint element contains a first frame port that is connected to a second frame port of the first cylinder element, as indicated in the block diagram by frame ports 450*a* and 450*g*, and the connection between them. The first frame port of the joint element may expose a frame on the joint where the first cylinder attaches to the joint. Likewise, the second frame port of the first cylinder element may expose a frame on the first cylinder where the joint is attached to the first cylinder.

The third cylinder element contains a first frame port that is connected to a second frame port of the joint element, as indicated in the block diagram by frame ports 450*i* and 450*h*, and the connection between them. The first frame port of the third cylinder element may expose a frame on the third cylinder where the joint attaches to the third cylinder. Likewise, the second frame port of the joint element may expose a frame on the joint where the third cylinder is attached to the joint.

Similarly, the fourth cylinder element contains a first frame port that is connected to a second frame port of the third cylinder elements, as indicated in the block diagram by frame ports 450*n* and 450*k*, and the connection between them. The first frame port of the fourth cylinder element may expose a frame on the fourth cylinder where the third cylinder attaches to the fourth cylinder. Likewise, the second frame port of the third cylinder element may expose a frame on the third cylinder where the fourth cylinder is attached to the third cylinder.

An absolute global inertial reference frame for the system, represented by network 910, may be exposed by a frame port for the base element that is indicated in the block diagram as port 450*d*. Positions and orientations of frames exposed by other frame ports in the network may be identified, as described above, using this reference frame. Alternatively, the frame port, indicated in the block diagram as port 450*d*, may expose a frame that is identified, for example, based on the absolute global inertial reference frame for the system and information (e.g., geometry information) associated with the base element. The information and/or the reference frame may or may not undergo a transformation in the base element in order to identify the exposed frame. Frames exposed by other frame ports in the network 910 may be identified, as described above, using this exposed frame.

Figure 10:
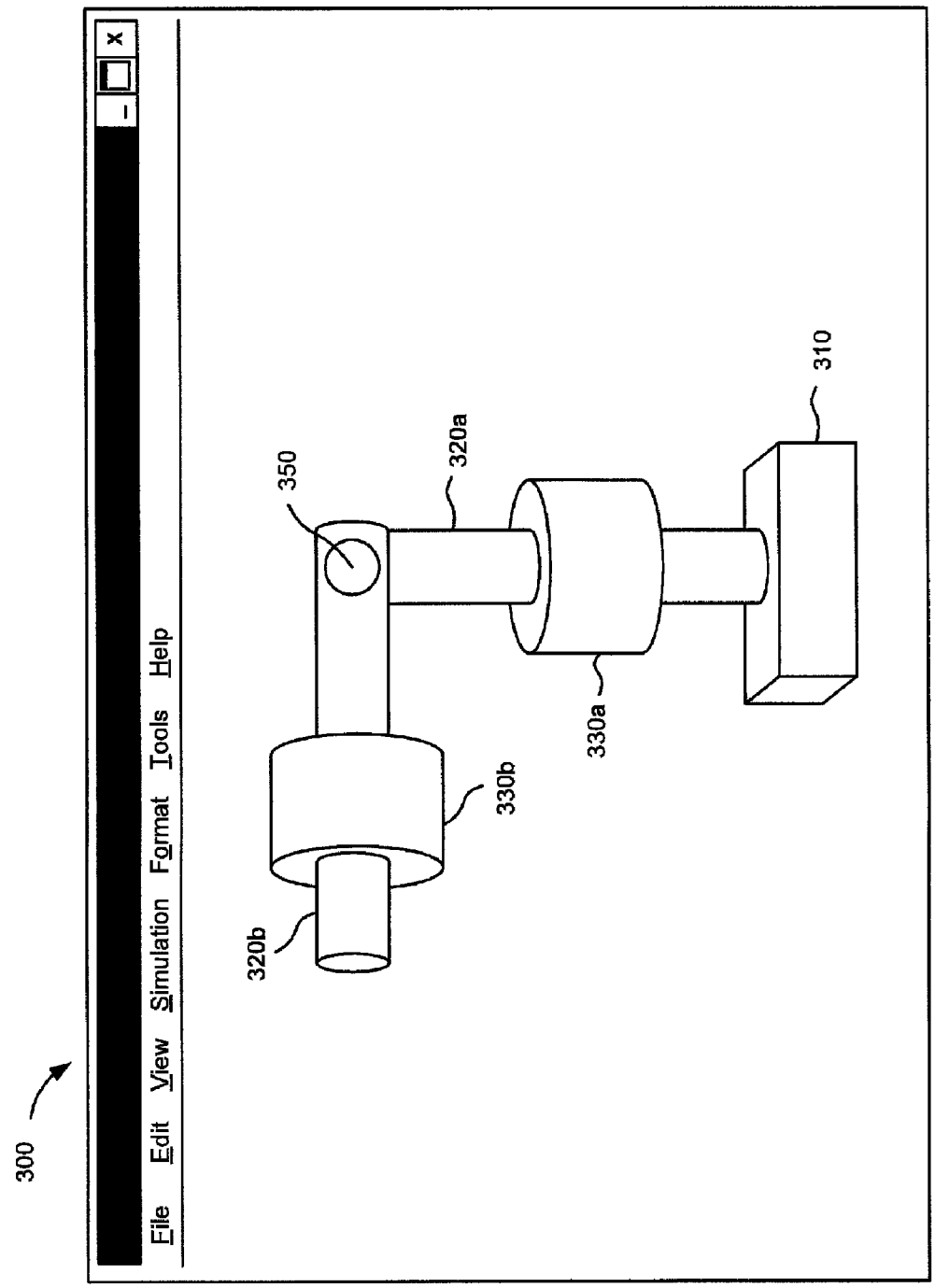
FIG. 10 illustrates an example geometric view that provides a visualization of the network illustrated in FIG. 9.

FIG. 10 illustrates an example geometric view 300 that may provide a visualization of network 910. Referring to FIG. 10, the geometric view 300 may include a 3-D graphical visualization of the network 910. The base element, first cylinder element, second cylinder element, joint element, third cylinder element, and fourth cylinder element of the network 910 may be graphically presented in the visualization as base object 310, cylinder object 320*a*, cylinder object 330*a*, cylinder object 320*b*, cylinder object 330*b*, and joint object 350, respectively.

Figure 11:
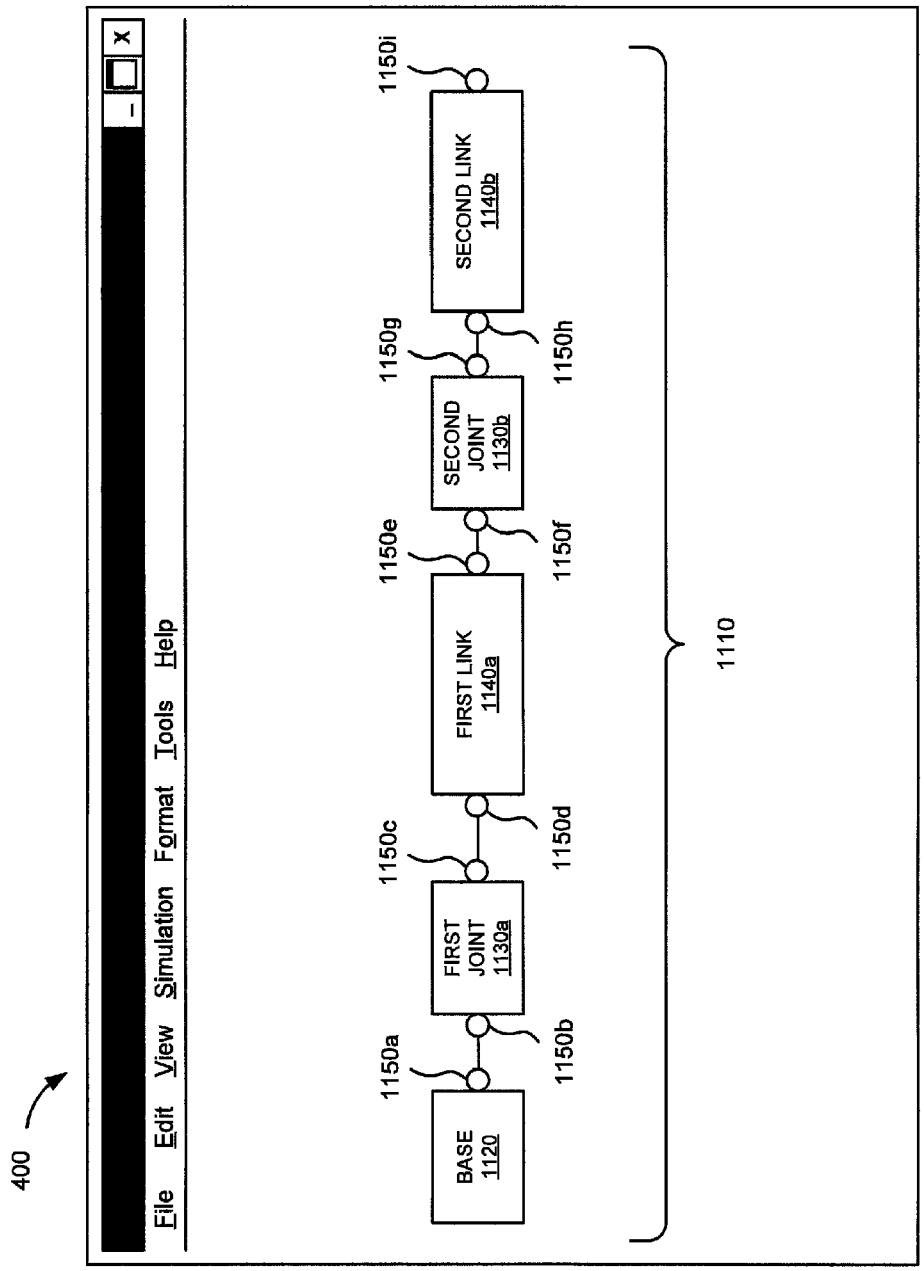
FIG. 11 illustrates an example block diagram view of a network that represents a system having a base, a first joint, a first link, a second joint, and a second link.

FIG. 11 illustrates an example block diagram view 400 of a network 1110 that represents a system having a base, first joint, first link, second joint, and a second link. Network 1110 may be an embodiment of network 260. Referring to FIG. 11, the network 1110 includes a base element, a first joint element, a first link element, a second joint element, and a second link element that may represent the base, first joint, first link, second joint, and second link in the system. The elements may be represented in the block diagram view 400 by blocks 1120, 1130*a*, 1140*a*, 1130*b*, and 1140*b*, respectively.

The base may be fixed at rest in an absolute global inertial reference frame defined by a world that the system resides in.

A frame port of the base element, represented in the block diagram as port 1150*a*, may expose this reference frame. Alternatively, the frame exposed by the frame port, represented in the block diagram as port 1150*a*, may be based, for example, on information (e.g., geometry information) associated with the base element and the reference frame. The information and/or the reference frame may or may not undergo a transformation in the base element in order to identify the exposed frame. Frames exposed by other frame ports in the network 1110 may be identified, as described above, using the frame exposed by the frame port represented in the block diagram as port 1150*a*.

The block diagram shows that the frame port of the base element is connected to a first frame port, represented by port 1150*b*, of the first joint element. The first frame port of the first joint element may expose a frame associated where the first joint attaches to the base. The first joint may provide two degrees of freedom for the first link. These degrees of freedom may enable the first link to rotate left and right on the base and pivot in an upward and downward direction from where the first joint attaches to the base.

A second frame port for the first joint element, represented by port 1150*c*, may expose a frame, associated with the first joint element, where the first joint attaches to the first link. A first frame port for the first link element, represented by port 1150*d*, may expose a frame, associated with the first link element, where the first link attaches to the first joint. Likewise, a second frame port of the first link element, represented by port 1150*e*, may expose a frame, associated with the first link, where the first link attaches to the second joint. A first frame port of the second joint element, represented by port 1150*f*, may expose a frame, associated with the second joint, where the second joint attaches to the first link. The second joint may provide one degree of freedom for the second link that enables the second link to pivot in an upwards or downwards direction from where the second link attaches to the second joint.

A second frame port of the second joint element, represented by port 1150*g*, may expose a frame associated with the second joint where the second joint attaches to the second link. A first frame port of the second link element, represented by port 1150*h*, may expose a frame associated with the second link where the second link attaches to the second joint. A second frame port of the second link element, represented by port 1150*i*, may expose a frame where a perturbation (not shown) may be applied to the system during a simulation of the system.

Figure 12:
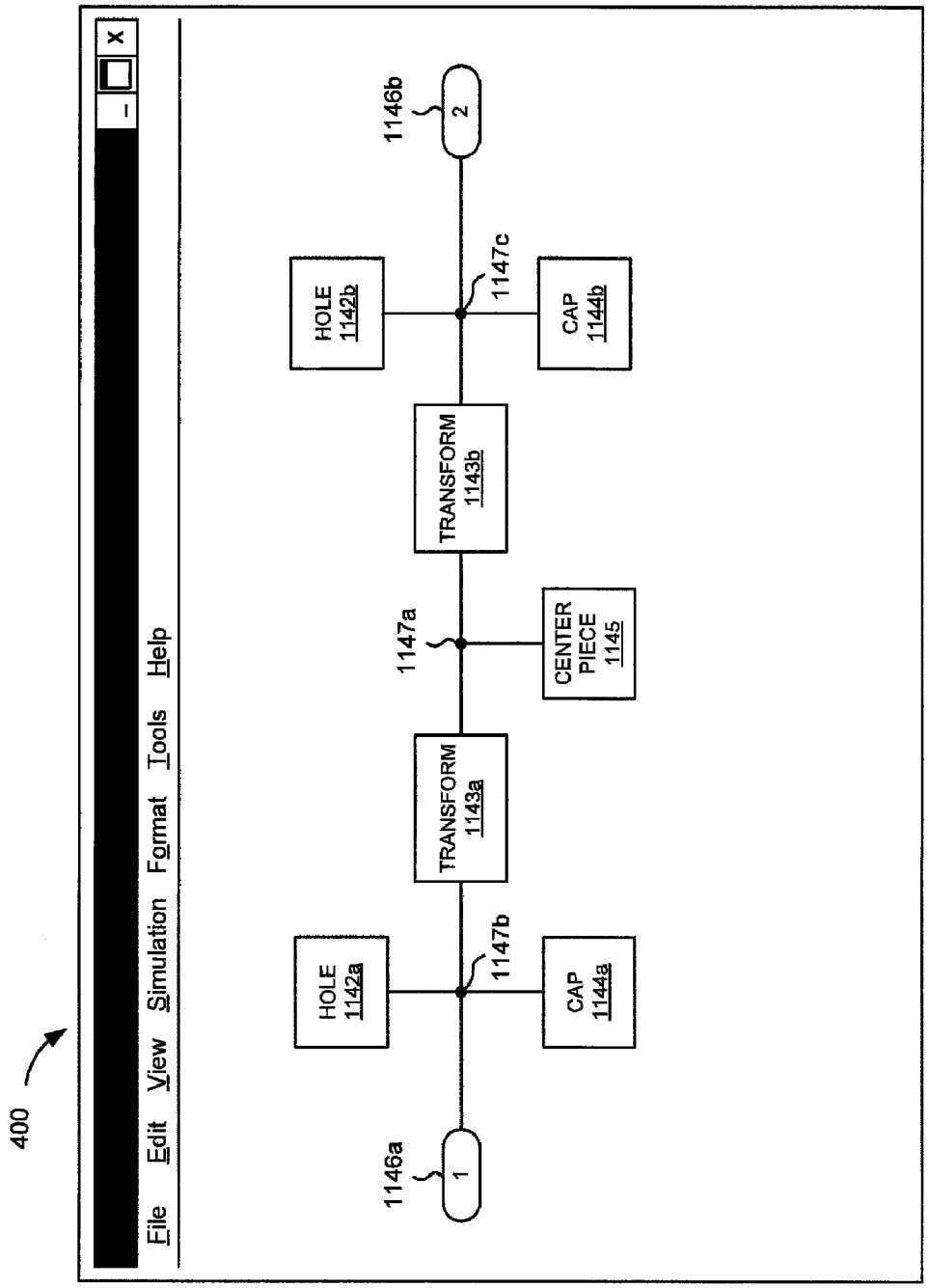
FIG. 12 illustrates an example block diagram view of a link contained in the system represented by the network illustrated in FIG. 11.

FIG. 12 illustrates an example block diagram view 400 of a link element contained in network 1110. Referring to FIG. 12, the link element may include a first frame port, a second frame port, a first hole element, a second hole element, a first cap element, a second cap element, a center piece element, a first transform element, and a second transform element, which are represented in the block diagram by blocks 1146*a*, 1146*b*, 1142*a*, 1142*b*, 1144*a*, 1144*b*, 1143*a*, 1143*b*, and 1145, respectively. The block diagram also illustrates frames 1147*a-c* that may be associated with a link represented by the link element.

The first hole element and second hole element may represent a first hole and a second hole, respectively, of the link. The first hole element and second hole element may contain information about the first hole and second hole, respectively. This information may include geometry information of the holes. For example, the first hole element may contain information about the circumference and radius of the first hole.

Likewise, the first cap element and second cap element may represent a first cap and second cap, respectively, of the link. These elements may contain information about the caps, which may include geometry information about the caps. The center piece element may represent a center piece of the link. This element may likewise contain information about the center piece, which may include geometry information about the center piece.

Frame 1147*a* may be a frame that indicates a position and orientation of the link with respect to a reference frame. The position and orientation may be identified (e.g., generated) based on (1) information contained in the center piece element and/or (2) a position and orientation information associated with another frame (e.g., the reference frame for the network 1110, a frame exposed by a frame port in the network 1110). For example, the position and orientation of frame 1147*a* may be identified based on geometry information contained in center piece element and a position and orientation of a reference frame for the system represented by network 1110. Likewise, for example, the position and orientation of frame 1147*a* may be identified based on geometry information contained in the center piece and a position and orientation for a frame that is exposed by a frame port associated with another element in the network 1110.

Position and orientations for frames 1147*b* and 1147*c* may be identified by transforming the position and orientation for frame 1147*a* using transform elements represented by blocks 1143*a-b*, respectively. For example, a function, associated with a transform element represented by block 1143*a*, may be applied to the position and orientation, represented by frame 1147*a*, to identify a position and orientation represented by frame 1147*b*.

Figure 13:
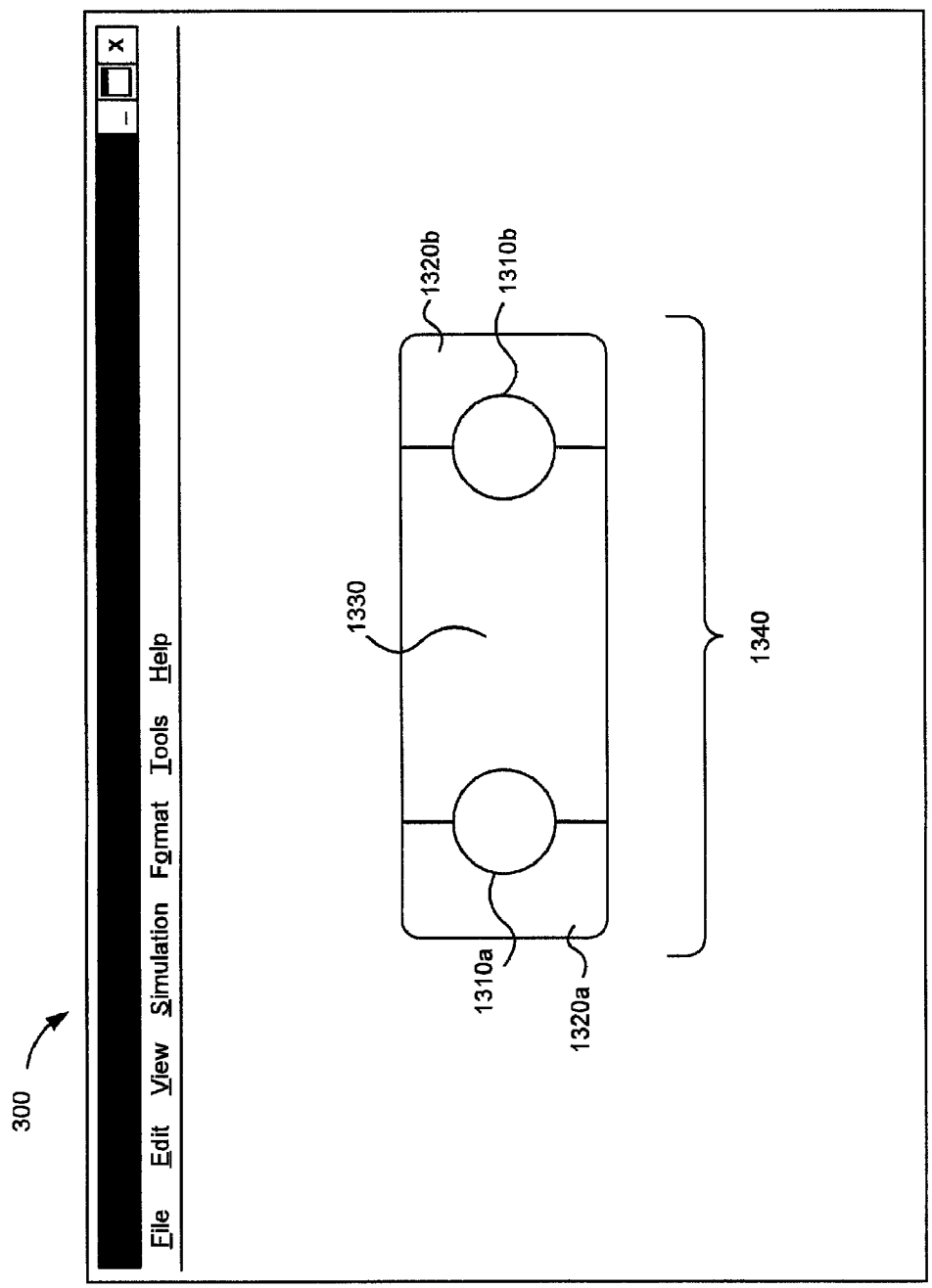
FIG. 13 illustrates an example geometric view that provides a visualization of the link illustrated in FIG. 12.

FIG. 13 illustrates an example geometric view 300 that may provide a visualization of a link in network 1110. The visualization may be based on the block diagram view 400 of the link, illustrated in FIG. 12. Referring to FIG. 13, the link may be graphically represented in the view 300 by graphical object 1340. The first hole, second hole, first cap, second cap, and center piece of the link may be graphically represented by graphical objects 1310*a*, 1310*b*, 1320*a*, 1320*b*, and 1330, respectively.

Figure 14:
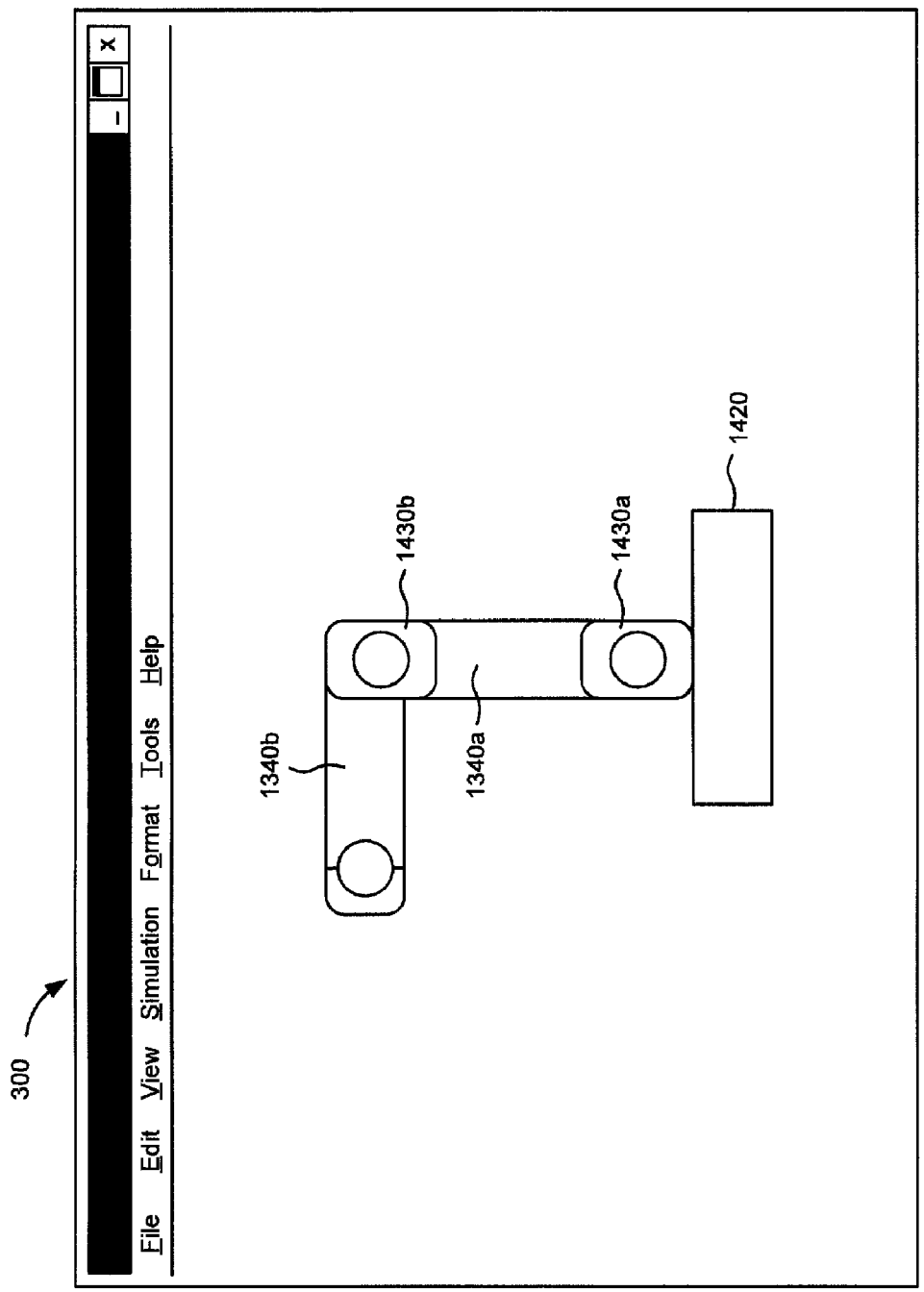
FIG. 14 illustrates an example geometric view that provides a visualization of the network illustrated in FIG. 11.

FIG. 14 illustrates an example geometric view 300 that may provide a visualization of network 1110. The first link element, second link element, first joint element, second joint element, and base element contained in the network 1110 are geometrically represented in the geometric view 300 as geometric objects 1340*a*, 1340*b*, 1430*a*, 1430*b*, and 1420, respectively. Note that the geometric view 300 of the network 1110 illustrated in FIG. 14 is a two-dimensional graphical view of the network 1110. It should be noted, however, that geometric view 300 may provide other dimensional graphical views of the network 1110, such as a three-dimensional graphical view of the network 1110.

As noted above, a frame, associated with an element in a network, may be identified based on (1) information associated with the element, such as, for example, geometry information of the element, and/or (2) a position and orientation associated with a frame, such as, for example, a frame exposed by a frame port associated with an element in the network. For example, referring back to FIG. 11, the frame exposed by the frame port illustrated by port 1150*a* may be identified based on (1) an absolute global inertial reference frame defined by a "world" that the system, represented by network 1110, resides in, and/or (2) information associated with the base. This frame (i.e., the frame exposed by the frame port illustrated by port 1150*a*) may be used to identify the frame that is exposed by the frame port illustrated by port 1150*b*. The frame exposed by the frame port illustrated by port 1150*b*, in turn, may be used along with information contained in the first joint element to identify the frame exposed by the frame port illustrated by port 1150*c*. This process may repeat, where the frame for the second link element that is exposed by the frame port, represented by port 1150*i*, may be identified based in part on the frame for the second link element that is exposed by the frame port represented by port 1150*h*.

Note that a path may be established that traces the frame exposed by the frame port, represented by port 1150*i*, back to the reference frame in the base element. Also note that changes made to a frame may affect those frames that are dependent on the changed frame. For example, frames that are "downstream" from the changed frame may need to be re-identified as these frames may be dependent on the changed frame. Likewise, for example, frames that are "upstream" from the changed frame may not need to be re-identified as these frames may not be dependent on the changed frame.

For example, referring again to FIG. 11, suppose the frames exposed by the frame ports, represented by ports 1150*a-i*, are identified as described above. Now suppose the frame exposed by the frame port represented by port 1150*e* changes. The frames exposed by the frame ports represented by ports 1150*f-i* may need to be re-identified, since they may be dependent on the changed frame. On the other hand, frames exposed by the frame ports represented by ports 1150*a-d* may not need to be re-identified since these frames may not be dependent on the changed frame.

Figure 15:
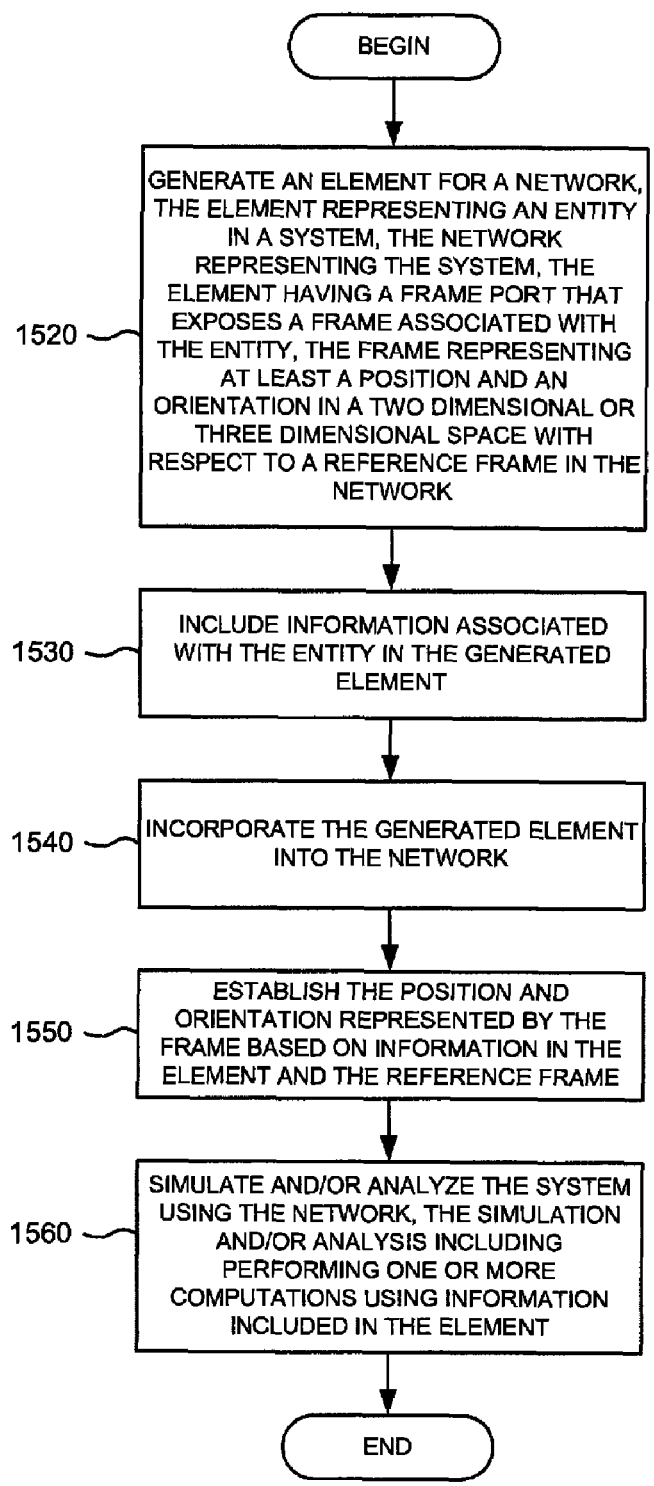
FIG. 15 illustrates a block diagram of example acts that may be used to, among other things, generate an element for a network and incorporate the element in the network.

FIG. 15 illustrates a block diagram of example acts that may be used to (1) generate an element that represents an entity of a system, (2) include geometry information of the entity in the element, (3) incorporate the element in a network that represents the system, and (4) simulate and/or analyze the system using the network, the simulation and/or analysis may include performing one or more computations using the geometry information.

Referring to FIG. 15, at block 1520, the element is generated. The generated element may have a frame port that may expose a frame associated with the entity. The frame may represent at least a position and an orientation in a two dimensional or three dimensional space with respect to a reference frame in the network.

At block 1530, information about the entity may be included in the generated element. This information may include, for example, geometry information associated with a geometry of the entity. At block 1540, the generated element may be incorporated into the network. The element may be incorporated, for example, by connecting the frame port to the network.

At block 1550, the position and orientation represented by the frame is established. The position and orientation of the frame may be established using the reference frame and information contained in the element (e.g., geometry information).

At block 1560, the system may be simulated and/or analyzed using the network. The simulation and/or analysis of the system may include performing one or more computations using information (e.g., geometry information) included in the element. The computations may involve one or more of dynamics, statics, equilibrium, mass, inertia, collision detection, collision response, or force fields associated with the system.

For example, referring to FIGS. 1, 2, 11, and 15, suppose that the system represented by network 1110 does not contain the second link and that the second link block 1140*b* is not displayed in the block diagram view 400 of the system illustrated in FIG. 11. Further suppose that a user directs editor 240 (FIG. 2) to generate an element that represents the second link in the system represented by network 1110.

The user may provide input to editor 240 to cause TCE 200 to generate the element. This input may include selecting block 1140*b* from a library and placing the selected block 1140*b* in the block diagram view 400 of the network 1110. The user may provide the input via an input device 160 (FIG. 1) and the block diagram view 400 of the network may be displayed on an output device 170.

In response to the user's input, the processing logic 120 may execute instructions in TCE 200 to generate the element that represents the second link. The generated element may be represented as a data object in the TCE 200 that contains information about the second link, such as geometry, mass, and tensor information associated with the second link. Portions of this information may be generated by the processing logic based on input provided by the user. For example, TCE 200 may display a GUI that enables the user to specify information about the second link (e.g., a size of the link, mass of the link). The TCE 200 may use the specified information to generate information (e.g., geometry information) contained in the element.

The user may incorporate the element into the network 1110 by connecting a first frame port of the element, represented in the block diagram as port 1150*h*, to a frame port of the second joint represented in the block diagram as port 1150*g*. The TCE 200 may establish positions and orientations for frames, exposed by the first and second frame ports, using information included in the element and information about the reference frame (e.g., a position and orientation represented by the reference frame).

The user may direct the TCE 200 to simulate the system. Simulation may include using geometry information associated with the generated element to perform computations associated with the system, such as computations involving dynamics, statics, equilibrium, mass, inertia, collision detection, collision response, and/or force fields associated with the system.

Figure 16:
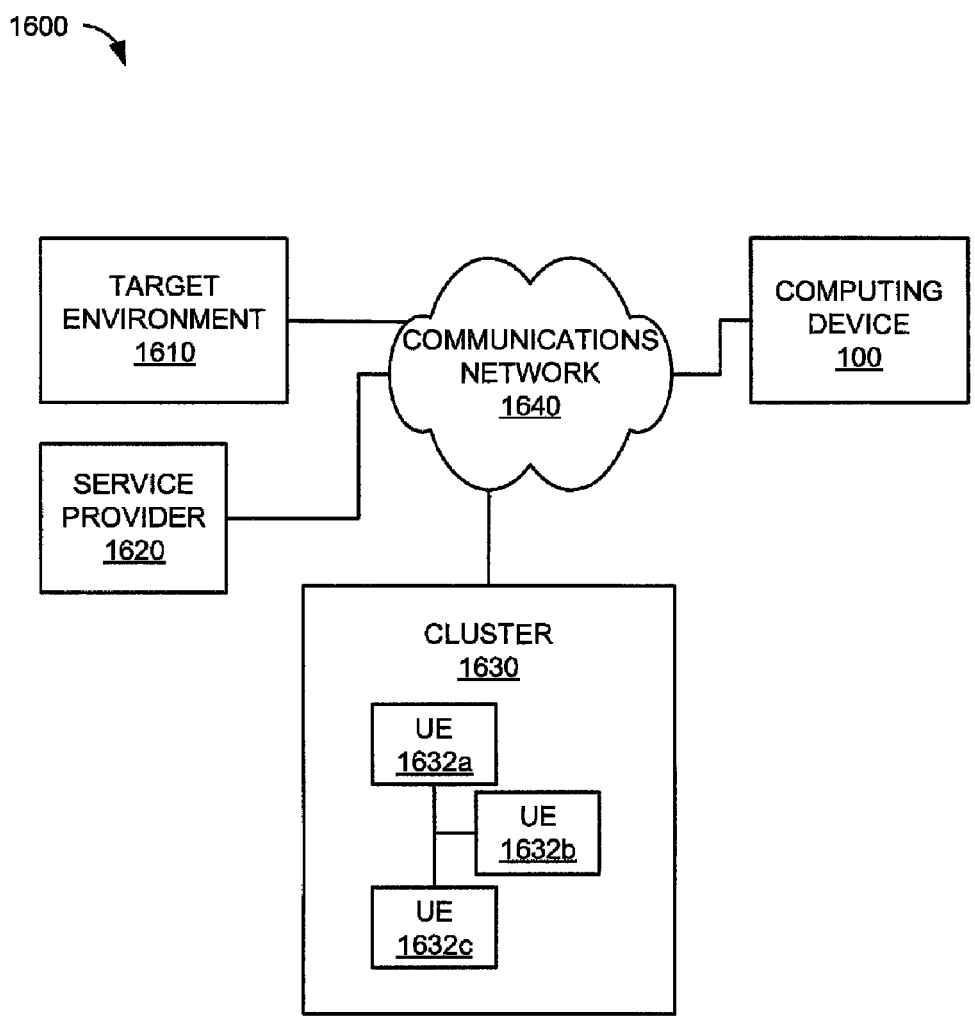
FIG. 16 illustrates a block diagram of an example of a distributed computing environment that may implement one or more embodiments of the invention.

One or more embodiments of the invention may be implemented in a distributed environment. FIG. 16 illustrates an example of a distributed environment 1600 that may implement one or more embodiments of the invention. Referring to FIG. 16, environment 1600 may contain various components including computing device 100, target environment 1610, service provider 1620, cluster 1630, and communications network 1640. Note that the distributed environment 1600 is just one example of a distributed environment that may be used with one or more embodiments of the invention. Other distributed environments that may be used with one or more embodiments of the invention may contain more components or fewer components than illustrated in FIG. 16. Moreover, the components in the distributed environments may be arranged differently than the arrangement shown in FIG. 16. In addition, the distributed environments may implement various "cloud computing" frameworks.

Details of computing device 100 were described above with respect to FIG. 1. In distributed environment 1600, computing device 100 may, among other things, exchange information (e.g., data) with other components in the communications network 1640 (e.g., target environment 1610, service provider 1620, and cluster 1630). Computing device 100 may interface with the communications network 1640 via a communication interface 180.

Target environment 1610 may be configured to interpret and/or execute, for example, one or more embodiments of the invention, which may be generated in or otherwise made available to the distributed environment 1600. The communications network 1640 may include digital and/or analog aspects. Information exchanged in communications network 1640 may include machine-readable information having a format that may be adapted for use, for example, in the communications network 1640 and/or with one or more components in the communications network 1640.

For example, the information may be encapsulated in one or more packets that may be used to transfer the information through the communications network 1640. Information may be exchanged between components in the communications network 1640 using various communication protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, or other communication protocol.

The communications network 1640 may comprise various network devices, such as gateways, routers, switches, firewalls, servers, repeaters, address translators, etc. Some or all of the communications network 1640 may be wired (e.g., using wired conductors, optical fibers) and/or wireless (e.g., using free-space optical (FSO), radio frequency (RF), acoustic transmission paths). Some or all of the communications network 1640 may include a substantially open public network, such as the Internet. Some or all of the communications network 1640 may include a more restricted network, such as a private corporate network or virtual private network (VPN). It should be noted that implementations of communications networks and/or devices operating on communications networks described herein are not limited with regards to, for example, information carried by the communications networks, protocols used in the communications networks, and/or the architecture/configuration of the communications networks.

Cluster 1630 may include a number of units of execution (UEs) 1632 that may execute or interpret one or more embodiments of the invention or portions thereof on behalf of computing device 100 and/or another component, such as service provider 1620. The UEs 1632 may reside on a single device or chip or on multiple devices or chips. For example, the UEs 1632 may be implemented in a single ASIC or in multiple ASICs. Likewise, the UEs 1632 may be implemented in a single computer system or multiple computer systems. Other examples of UEs 1632 may include, for example, some combination of FPGAs, CPLDs, ASIPs, processors, multiprocessor systems-on-chip (MPSoCs), graphic processing units, and/or microprocessors. The UEs 1632 may be configured to perform operations on behalf of another component in the distributed environment 1600. For example, in an embodiment, the UEs 1632 are configured to execute portions of code associated with the programming environment 200. Here, the programming environment 200 may dispatch certain activities pertaining to one or more embodiments of the invention to the UEs 1632 for execution. The service provider 1620 may configure cluster 1630 to provide, for example, the above-described services to computing device 100 on a subscription basis (e.g., via a web service).

The foregoing description of embodiments is intended to provide illustration and description, but is not intended to be exhaustive or to limit the invention to the precise form disclosed. Modifications and variations are possible in light of the above teachings or may be acquired from a practice of the invention. For example, while a series of acts has been described above with respect to FIG. 15, the order of the acts may be modified in other implementations. Further, non-dependent acts may be performed in parallel. Also, the term "user", as used herein, is intended to be broadly interpreted to include, for example, a computing device (e.g., a workstation) or a user of a computing device, unless otherwise stated.

It will be apparent that one or more embodiments, described herein, may be implemented in many different forms of software and hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain embodiments of the invention may be implemented as logic that performs one or more functions. This logic may be hardware-based, software-based, or a combination of hardware-based and software-based. Some or all of the logic may be stored in one or more tangible computer-readable storage media and may include computer-executable instructions that may be executed by processing logic, such as processing logic 120. The computer-executable instructions may include instructions that implement one or more embodiments of the invention. The tangible computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

It is intended that the invention not be limited to the particular embodiments disclosed above, but that the invention will include any and all particular embodiments and equivalents falling within the scope of the following appended claims.

What is claimed is:

1. A computer-implemented method, comprising:
generating, using processing logic, a block representing an information element for an entity of a network for incorporation into a block diagram that graphically represents the network, the network representing a system, the information element including geometry information about a geometry of the entity of the system, the geometry information being used in one or more computations associated with a simulation of the block diagram or an analysis of the system that the network represents, the block representing the information element having a frame port that exposes a first frame, the first frame representing at least a position and an orientation in a two dimensional or three dimensional space with respect to a second frame in the network; and
incorporating the generated block into the block diagram that represents the network by connecting the frame port to another block in the block diagram.

2. The method of claim 1, wherein the one or more computations include one or more computations of at least one of dynamics, statics, equilibrium, mass, inertia, collision detection, collision response, or force fields associated with the system.

3. The method of claim 1, wherein at least a portion of the geometry of the entity is specified in the geometry information as one or more parameters of the element.

4. The method of claim 3, wherein the one or more parameters include at least one of:
   a radius of the entity, a circumference of the entity, a length of the entity, a width of the entity, or one or more control points that define a curve of the entity.

5. The method of claim 1, wherein at least a portion of the geometry of the entity is specified in the geometry information by a low-level representation of the entity.

6. The method of claim 5, wherein the low-level representation of the entity is based on numerical coordinates.

7. The method of claim 1, further comprising:
   acquiring the geometry information from at least one of a file, a communications network, or a user interface.

8. The method of claim 1, wherein the first frame lies outside the geometry of the entity.

9. The method of claim 1, wherein at least one of the position or the orientation is defined by one or more variables.

10. The method of claim 1, wherein at least one of the position or the orientation is defined in terms of a function on a geometric feature of the entity.

11. The method of claim 1, further comprising:
    displaying a representation of the generated element in a diagram of the network.

12. The method of claim 1, wherein the second frame is a reference frame.

13. One or more tangible computer-readable storage media for storing computer-executable instructions executable by processing logic, the media storing one or more instructions for:
    generating a block representing an information element for an entity for incorporation into a block diagram that graphically represents the network that represents a system, the information element including geometry information about a geometry of the entity of the system, the geometry information being used in one or more computations associated with a simulation of the block diagram or an analysis of the system that the network represents, the element having a frame port that exposes a first frame, the first frame representing at least a position and an orientation in a two dimensional or three dimensional space with respect to a second frame in the network; and
    incorporating the generated block into the block diagram that represents the network by connecting the frame port to another block in the block diagram.

14. The medium of claim 13, wherein the one or more computations include one or more computations of at least one of dynamics, statics, equilibrium, mass, inertia, collision detection, collision response, or force fields associated with the system.

15. The medium of claim 13, wherein at least a portion of the geometry of the entity is specified in the geometry information includes at least one of:
    a radius of the entity, a length of the entity, a width of the entity, or one or more control points that define a curve of the entity.

16. The medium of claim 13, further comprising one or more instructions for:
    acquiring the geometry information from an external source.

17. The medium of claim 13, further comprising:
    displaying a representation of the generated element in a diagram of the network.

18. The medium of claim 13, wherein the second frame is a reference frame.

* * * * *